United States Patent
Stowers et al.

(10) Patent No.: US 10,782,610 B2
(45) Date of Patent: *Sep. 22, 2020

(54) RADIATION BASED PATTERNING METHODS

(71) Applicant: Inpria Corporation, Corvallis, OR (US)

(72) Inventors: Jason K. Stowers, Corvallis, OR (US); Alan J. Telecky, Albany, OR (US); Douglas A. Keszler, Corvallis, OR (US); Andrew Grenville, Eugene, OR (US)

(73) Assignee: Inpria Corporation, Corvallis, OR (US)

(*) Notice: Subject to any disclaimer, the term of this patent is extended or adjusted under 35 U.S.C. 154(b) by 5 days.

This patent is subject to a terminal disclaimer.

(21) Appl. No.: 15/784,258

(22) Filed: Oct. 16, 2017

(65) Prior Publication Data

US 2018/0039172 A1 Feb. 8, 2018

Related U.S. Application Data

(60) Division of application No. 14/858,612, filed on Sep. 18, 2015, now Pat. No. 9,823,564, which is a
(Continued)

(51) Int. Cl.
*G03F 7/00* (2006.01)
*G03F 7/004* (2006.01)
(Continued)

(52) U.S. Cl.
CPC .......... *G03F 7/0043* (2013.01); *G03F 7/0042* (2013.01); *G03F 7/20* (2013.01); *G03F 7/327* (2013.01); *Y10T 428/24355* (2015.01)

(58) Field of Classification Search
CPC ....................................................... G03F 7/00
See application file for complete search history.

(56) References Cited

U.S. PATENT DOCUMENTS

| | | | |
|---|---|---|---|
| 3,385,915 | A | 5/1968 | Hamling |
| 4,014,858 | A | 3/1977 | Chipman et al. |

(Continued)

FOREIGN PATENT DOCUMENTS

| | | | |
|---|---|---|---|
| CN | 1457504 A | | 11/2003 |
| CN | 102027603 A | | 4/2011 |

(Continued)

OTHER PUBLICATIONS

Stowers, Jason K.: "Direct patterning of solution deposited metal oxides", Oregon State University—ProQuest Dissertations and These, Aug. 14, 2008 (Aug. 14, 2008), XP002675373, ISBN: 9780549913726 Retrieved from the Internet: (Year: 2008).*

(Continued)

*Primary Examiner* — Chanceity N Robinson
(74) *Attorney, Agent, or Firm* — Christensen, Fonder, Dardi; Diane E. Bennett; Peter S. Dardi

(57) ABSTRACT

Stabilized precursor solutions can be used to form radiation inorganic coating materials. The precursor solutions generally comprise metal suboxide cations, peroxide-based ligands and polyatomic anions. Design of the precursor solutions can be performed to achieve a high level of stability of the precursor solutions. The resulting coating materials can be designed for patterning with a selected radiation, such as ultraviolet light, x-ray radiation or electron beam radiation. The radiation patterned coating material can have a high contrast with respect to material properties, such that development of a latent image can be successful to form lines with very low line-width roughness and adjacent structures with a very small pitch.

19 Claims, 8 Drawing Sheets

Related U.S. Application Data continuation of application No. 12/850,867, filed on Aug. 5, 2010, now Pat. No. 9,176,377.

(60) Provisional application No. 61/350,103, filed on Jun. 1, 2010.

(51) Int. Cl.
  *G03F 7/20* (2006.01)
  *G03F 7/32* (2006.01)

(56) References Cited

U.S. PATENT DOCUMENTS

| | | | |
|---|---|---|---|
| 4,102,683 A | 7/1978 | DiPiazza | |
| 4,104,292 A | 8/1978 | Dworkin et al. | |
| 4,144,222 A | 3/1979 | Shinmi et al. | |
| 4,174,346 A | 11/1979 | Collins et al. | |
| 4,370,405 A | 1/1983 | O'Toole et al. | |
| 4,380,559 A | 4/1983 | Mandai et al. | |
| 4,601,917 A | 7/1986 | Russo et al. | |
| 4,639,208 A | 1/1987 | Inui et al. | |
| 4,732,841 A | 3/1988 | Radigan | |
| 4,851,481 A | 1/1989 | Kuriyama et al. | |
| 4,891,303 A | 1/1990 | Garza et al. | |
| 4,910,122 A | 3/1990 | Arnold et al. | |
| 5,025,094 A | 6/1991 | King | |
| 5,672,243 A | 9/1997 | Hsia et al. | |
| 6,020,269 A | 2/2000 | Wang et al. | |
| 6,060,380 A | 5/2000 | Subramanian et al. | |
| 6,183,716 B1 | 2/2001 | Sleight et al. | |
| 6,194,323 B1 | 2/2001 | Downey et al. | |
| 6,197,896 B1 | 3/2001 | Aviram et al. | |
| 6,268,457 B1 | 7/2001 | Kennedy et al. | |
| 6,287,951 B1 | 9/2001 | Lucas et al. | |
| 6,387,012 B1 | 5/2002 | Mitamura | |
| 6,420,088 B1 | 7/2002 | Angelopoulos et al. | |
| 6,566,276 B2 | 5/2003 | Maloney et al. | |
| 6,583,071 B1 | 6/2003 | Weidman et al. | |
| 6,730,454 B2 | 5/2004 | Pfeiffer et al. | |
| 6,844,604 B2 | 1/2005 | Lee et al. | |
| 6,927,108 B2 | 8/2005 | Weng et al. | |
| 6,946,677 B2 | 9/2005 | Ostergard | |
| 7,001,821 B2 | 2/2006 | Aggarwal et al. | |
| 7,208,341 B2 | 4/2007 | Lee et al. | |
| 7,256,129 B2 | 8/2007 | Nam et al. | |
| 8,053,370 B2 | 11/2011 | Yang et al. | |
| 8,092,703 B2 | 1/2012 | Ishibashi et al. | |
| 8,158,338 B2 * | 4/2012 | Fedynyshyn | G03F 7/0045 430/270.1 |
| 8,257,910 B1 * | 9/2012 | Guerrero | G03F 7/091 430/322 |
| 8,415,000 B2 | 4/2013 | Stowers et al. | |
| 8,426,107 B2 | 4/2013 | Takahashi et al. | |
| 8,828,493 B2 * | 9/2014 | Cheng | G03F 7/0392 427/258 |
| 8,951,917 B2 | 2/2015 | Ogihara et al. | |
| 9,310,684 B2 | 4/2016 | Meyers et al. | |
| 2002/0076495 A1 | 6/2002 | Maloney et al. | |
| 2002/0160298 A1 | 10/2002 | Minami et al. | |
| 2004/0067444 A1 | 4/2004 | Wakabayashi et al. | |
| 2005/0242330 A1 | 11/2005 | Herman et al. | |
| 2006/0088962 A1 | 4/2006 | Herman et al. | |
| 2006/0234138 A1 | 10/2006 | Fehlhaber et al. | |
| 2008/0055597 A1 | 3/2008 | Sun et al. | |
| 2008/0286683 A1 | 11/2008 | Brodsky et al. | |
| 2009/0174036 A1 | 7/2009 | Fuller et al. | |
| 2009/0214823 A1 * | 8/2009 | Cheng | B81C 1/00031 428/137 |
| 2010/0044698 A1 | 2/2010 | Herman et al. | |
| 2010/0099908 A1 | 4/2010 | Yoshitomo et al. | |
| 2010/0119939 A1 * | 5/2010 | Misumi | G03F 7/022 429/212 |
| 2010/0167217 A1 * | 7/2010 | Ando | G03F 7/0035 430/326 |
| 2010/0184259 A1 | 7/2010 | Radigan et al. | |
| 2010/0279228 A1 | 11/2010 | Davis et al. | |
| 2011/0045406 A1 | 2/2011 | Keszler et al. | |
| 2011/0135823 A1 | 6/2011 | Lee et al. | |
| 2011/0166268 A1 | 7/2011 | Deelman et al. | |
| 2011/0206599 A1 | 8/2011 | Keszler et al. | |
| 2011/0244403 A1 | 10/2011 | Carcasi et al. | |
| 2011/0293888 A1 | 12/2011 | Stowers et al. | |
| 2012/0202349 A1 | 8/2012 | Sun | |
| 2012/0223418 A1 | 9/2012 | Stowers et al. | |
| 2013/0078796 A1 | 3/2013 | Ganesan et al. | |
| 2013/0224652 A1 | 8/2013 | Bass et al. | |
| 2013/0253161 A1 | 9/2013 | Amako et al. | |
| 2014/0303283 A1 | 10/2014 | Ding et al. | |
| 2015/0221519 A1 | 8/2015 | Marks et al. | |
| 2016/0116839 A1 | 4/2016 | Meyers et al. | |

FOREIGN PATENT DOCUMENTS

| | | | |
|---|---|---|---|
| EP | 1326136 A1 | 7/2003 | |
| EP | 1992665 A1 | 11/2008 | |
| JP | S63-241061 A | 10/1988 | |
| JP | H03-148659 A | 6/1991 | |
| JP | 2001-81560 A | 3/2001 | |
| JP | 2001-154366 A | 6/2001 | |
| JP | 2003-218118 A | 7/2003 | |
| JP | 2006-284947 | 10/2006 | |
| JP | 2008-091215 A | 4/2008 | |
| JP | 2007-514182 | 5/2008 | |
| JP | 2009-533521 A | 9/2009 | |
| JP | 2010-094583 A | 4/2010 | |
| JP | 2016-530565 A | 9/2016 | |
| JP | 2018-502173 A | 1/2018 | |
| KR | 10-2003-0007904 | 1/2003 | |
| KR | 10-2011-0132288 | 12/2011 | |
| WO | 2005-043246 | 5/2005 | |
| WO | WO-2008082448 A1 * | 7/2008 | ......... H01L 29/4908 |
| WO | 2008-082448 | 10/2008 | |
| WO | 2009-120169 | 10/2009 | |
| WO | 2009-138474 A1 | 11/2009 | |
| WO | 2010-000504 A1 | 1/2010 | |
| WO | 2014-150411 A1 | 9/2014 | |
| WO | 2016-065120 A1 | 4/2016 | |

OTHER PUBLICATIONS

Stowers J et al: "High resolution, high sensitivity inorganic resists", Microelectronic Engineering, Elsevier Publishers Bv,, Amsterdam, NL, vol. 86, No. 4-6, Apr. 1, 2009 (Apr. 1, 2009), pp. 730-733, (Year: 2009).*

Ahmed et al., "Synthesis and Characterization of Zirconium and Hafnium Sulfates, Hydroxide Sulfates and Oxide Sulfates", Acta Chemica Scandinavica, 53:24-33 (1999).

International Standard ISO 21348 "Space Environment (Natural and Artificial)—Process for Determining Solar Irradiances", First Edition 2007, Reference No. ISO 21348:2007(E).

Meyers et al., "Solution-Processed Aluminum Oxide Phosphate Thin-Film Dielectrics" Chem. Mater., 2007, 19, 4023-4029. Abstract Only.

Nakatta et al., "Improvement of InGaZnO4 Thin Film Transistors Characteristics Utilizing Excimer Laser Annealing" The Japan Society of Applied Physics, 2009.

Neef et al., "Effects of Carbon/Hardmask Interactions on Hardmask Performance", Proceedings of SPIE, 7273, 727311-1-727311-7 (2009).

Owen et al., "1/8 μm Optical Lithography," J. Vac. Sci. Technol. B 10, 3032 (1992).

Stowers, "Direct Patterning of Solution Deposited Metal Oxides", A Dissertation to Oregon State University, Aug. 14, 2008.

Stowers et al., "High Resolution, High Sensitivity Inorganic Resists", Microelectronic Engineering, 86:730-733 (2009).

Stowers et al., "Directly Patterned Inorganic Hardmask for EUV Lothography," Proc. SPIE 7969, 796915 (2011); http://dx.doi.org/10.1117/12.879542.

Wang et al.,"TiO2 Micro-Devices Fabricated by Laser Direct Writing" Optics Express, 19(18):17390-17935 (Aug. 29, 2011).

(56) References Cited

OTHER PUBLICATIONS

Zhang et al., Stabilization of Cubic ZrO2 With Rh(III) and/or La(III), Journal of Solid State Chemistry, 72:131-136 (1988).
Zimmerman, "Extension Options for 193nm Immersion Lithography", Journal of Photopolymer Science and Technology, 22(5):625-634 (2009) (Abstract), for full article please see http://www.jstage.jst.go.jp/article/photopolymer/22/5/625/_pdf.
Supplementary European Search Report From Corresponding European Patent Application No. 11168027.8 dated Jan. 6, 2012.
Office Action From Co-pending Korean Application No. 10-2011-0052919 dated Mar. 14, 2013.
Office Action From Co-pending Japanese Application No. 2011-120402 dated Jun. 11, 2013.
Office Action From Co-pending Taiwan Application No. 100116897 dated Jul. 29, 2013 (with translation).
Office Action From Co-pending Japanese Application No. 2015-207978 dated Aug. 23, 2016.
Anonymous: "International Technology Roadmap for Semiconductors 2009 Edition Executive Summary", Jan. 1, 2009, XP055464243, Retrived from the Internet: URL:https://www.semiconductors.prg/clientuploads/Research_Technology/ITRS/2009/1_Executive%20Summary.pdf.
Lee et al., "Effect of line-edge roughness (LER) and line-width roughness (LWR) on sub-100-nm device performance", Microlithography 2004, vol. 5376, May 14, 2004, p. 426, XP055464997, DOI: 10.1117/12.534926.
Morecroft et al., "Sub-15nm nanoimprint Molds and Pattern Transfer", Journal of Vacuum Science and Technology: Part B, AVS / AIP, Melville, New York, NY, vol. 27, No. 6, Dec. 3, 2009, pp. 2837-2840, XP012129582, ISSN:1071-1023 DOI: 10.1116/1.3264670.
Office Action from Co-pending European Application No. 15178638.1 dated Apr. 16, 2018.
Chandrasekhar et al., "Organotin Assemblies Containing SN—O Bonds," Coordination Chemistry Reviews 235:1-52 (2002).
Eychennee-Baron et al., "New Synthesis of the Nanobuilding Block {(BuSn)12O14(OH)6 }2+ and Exchange Properties of {(BuSn)12O14(OH)6}(O3SC6H4CH3)2," Journal of Organometallic Chemistry, 567:137-142 (1998).
Eychenne-Baron et al., "Reaction of Butyltin Hydroxide Oxide With p-Toluenesulfonic Acid: Synthesis, X-ray Crystal Analysis, and Multinuclear NMR Characterization of {(BuSn)12O14(OH)6}(4-CH3C6H4SO3)2," Organometallics 19:1940-1949 (2000).

\* cited by examiner

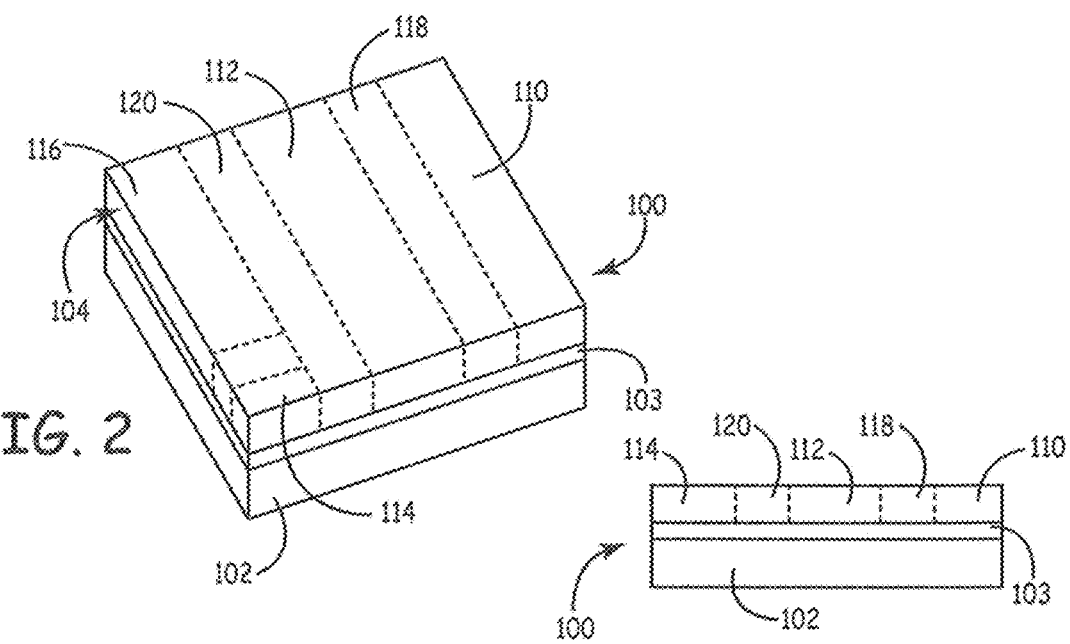
FIG. 2
FIG. 3
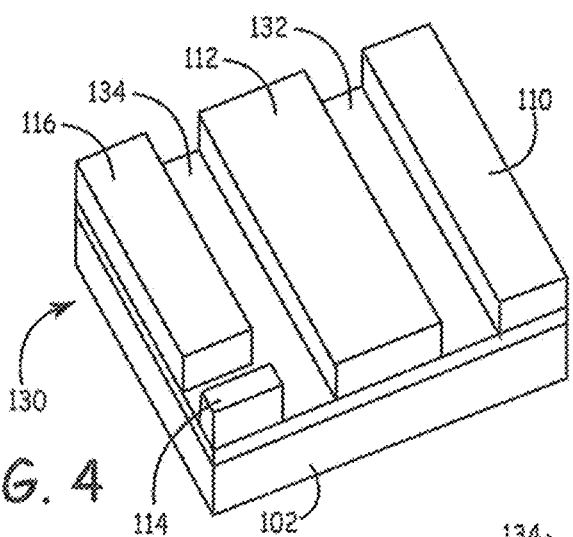
FIG. 4
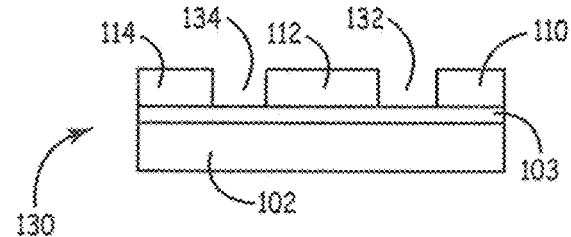
FIG. 5

RADIATION BASED PATTERNING METHODS

CROSS REFERENCE TO RELATED APPLICATIONS

This application is a divisional of copending U.S. patent application Ser. No. 14/858,612 to Stowers et al., filed on Sep. 18, 2015, entitled "Patterned Inorganic Layers, Radiation Based Patterning Compositions and Corresponding Methods," which is a continuation of U.S. patent application Ser. No. 12/850,867 to Stowers et al. (now U.S. Pat. No. 9,176,377), filed Aug. 5, 2010, entitled "Patterned Inorganic Layers, Radiation Based Patterning Compositions and Corresponding Methods," which claims priority to U.S. provisional patent application Ser. No. 61/350,103 to Stowers et al., entitled "Photopatternable Inorganic Hardmask," all of which are incorporated herein by reference.

STATEMENT AS TO GOVERNMENT RIGHTS

Development of the inventions described herein was at least partially funded with government support through U.S. National Science Foundation grants DGE-0549503 and IIP-0912921, and the U.S. government has certain rights in the inventions.

FIELD OF THE INVENTION

The invention relates to patterned inorganic layers that can be used to form elements of devices and/or as a resist for facilitating the patterning of other materials. The invention further relates to radiation based methods for the performance of the patterning and to precursor solutions that can be deposited to form a coating that can be patterned with very high resolution with radiation.

BACKGROUND OF THE INVENTION

For the formation of semiconductor-based devices as well as other electronic devices, the materials are generally patterned to integrate the structure. Thus, the structures are generally formed through an iterative process of sequential deposition and etching steps through which a pattern is formed of the various materials. In this way, a large number of devices can be formed into a small area. Some advances in the art can involve that reduction of the footprint for devices, which can be desirable to enhance performance.

Organic compositions can be used as radiation patterned resists so that a radiation pattern is used to alter the chemical structure of the organic compositions corresponding with the pattern. For example, processes for the patterning of semiconductor wafers can entail lithographic transfer of a desired image from a thin film of organic radiation-sensitive material. The patterning of the resist generally involves several steps including exposing the resist to a selected energy source, such as through a mask, to record a latent image and then developing and removing selected regions of the resist. For a positive-tone resist, the exposed regions are transformed to make such regions selectively removable, while for negative-tone resist, the unexposed regions are more readily removable.

Generally, the pattern can be developed with radiation, a reactive gas or liquid solution to remove the selectively sensitive portion of the resist while the other portions of the resist act as a protective etch resistant layer. However, liquid developers can be used effectively to develop the image. The substrate can be selectively etched through the windows or gaps in the remaining areas of the protective resist layer. Alternatively, desired materials can be deposited into the exposed regions of the underlying substrate through the developed windows or gaps in the remaining areas of the protective resist layer. Ultimately, the protective resist layer is removed. The process can be repeated to form additional layers of patterned material. The functional inorganic materials can be deposited using chemical vapor deposition, physical vapor deposition or other desired approaches. Additional processing steps can be used, such as the deposition of conductive materials or implantation of dopants. In the fields of micro- and nanofabrication, feature sizes in integrated circuits have become very small to achieve high-integration densities and improve circuit function.

SUMMARY OF THE INVENTION

In a first aspect, the invention pertains to an aqueous inorganic patterning precursor solution comprising a mixture of water, metal suboxide cations, polyatomic inorganic anions and ligands comprising peroxide groups, wherein the composition has a molar concentration ratio of ligands to metal suboxide cations of at least about 2 and wherein the resist composition is stable with respect to phase separation for at least about 2 hours without additional mixing.

In a further aspect, the invention pertains to a method for formation of a radiation sensitive inorganic coating precursor solution, the method comprising combining a first aqueous solution comprising metal suboxide cations, a complexing solution comprising a ligand having a peroxide group and a composition comprising a polyatomic inorganic anion to form the coating precursor solution. In some embodiments, the molar concentration ratio of ligands to metal suboxide cations is at least about 2.

In another aspect, the invention pertains to a method for patterning an inorganic material on a substrate, the method comprising forming a layer of a radiation patternable coating material to form a coated substrate, heating the coated substrate to remove at least a portion of the solvent, exposing the coated substrate to a pattern of radiation and heating the coated substrate after irradiation. Generally, the patterned coating material comprises metal suboxide cations, ligands comprising a peroxide group and inorganic polyatomic anions. The irradiation of the coated substrate can condense the coating at the irradiated locations. The heating of the coated substrate after irradiation can be to a temperature of at least about 45° C. prior to contacting the coating with a developer.

In other aspects, the invention pertains to a patterned structure comprising a substrate and a patterned inorganic material on a surface of the substrate. The patterned inorganic material can comprise a patterned semiconductor material or a patterned dielectric material, and the patterned inorganic material can have edges with an average linewidth roughness no more than about 2.25 nm at a pitch of no more than about 60 nm or for individual features having an average width of no more than about 30 nm.

In additional aspects, the invention pertains to a method for forming a patterned structure comprising a substrate and a patterned inorganic material on a surface of the substrate. The method can comprise irradiating a layer of coating material with extreme ultraviolet light at a dose of no more than about 100 mJ/cm$^2$ or an electron beam at a dose equivalent to no more than about 300 μC/cm$^2$ at 30 kV, and contacting the irradiated layer with a developing composition to dissolve un-irradiated material to form the patterned inorganic material. In some embodiments, the patterned inorganic material has an average pitch of no more than about 60 nm or for individual features having an average width of no more than about 30 nm.

BRIEF DESCRIPTION OF THE DRAWINGS

FIG. 2 is a schematic perspective view of a radiation patterned structure with a latent image.

FIG. 3 is a side plan view of the structure of FIG. 2.

FIG. 4 is a schematic perspective view of the structure of FIG. 2 after development of the latent image to remove un-irradiated coating material to form a patterned structure.

FIG. 5 is a side view of the patterned structure of FIG. 4.

DETAILED DESCRIPTION OF THE INVENTION

Figure 1:
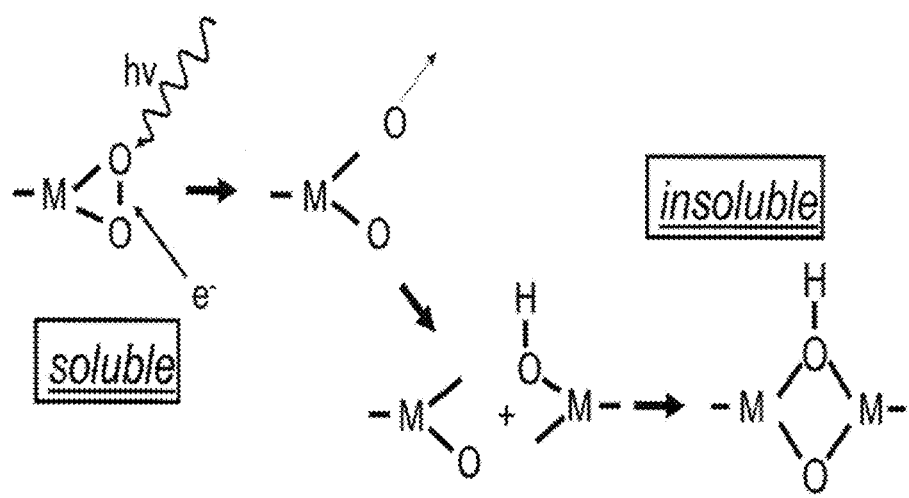
FIG. 1 is a schematic drawing depicting a metal cation bonded to a ligand, where M represents a metal atom and O represents an oxygen atom, undergoing a condensation reaction triggered by energy absorption from radiation.

Significant improvements in inorganic precursor solutions provide for superior direct patterning results for inorganic oxide materials comprising polyatomic ions. The precursor solutions can be used to deposit an inorganic coating material that is radiation sensitive. In embodiments of particular interest, exposure to the radiation converts the irradiated coating material into a condensed material that is resistant to removal with a developer composition. Selective removal of at least a portion of the un-irradiated coating material leaves a pattern including regions of the condensed coating material and regions where the un-irradiated coating material has been removed to expose the underlying substrate. The coating materials can be designed to be sensitive to selected radiation, such as ultraviolet light and/or electron beams. Furthermore, the precursor solutions can be formulated to be stable with an appropriate shelf life for commercial distribution.

The compositional changes to form the improved precursor solutions also provide for improved development of the image. In particular, the irradiated coating material can result in a stable inorganic material with a high level of resistance to the developer, e.g., a suitable liquid to dissolve un-irradiated coating material. Thus, the coating layers can be made thin without removing the condensed coating material during development. Compared to conventional organic resists, the inorganic materials described herein have extremely high resistance to many etch chemistries for commercially relevant functional layers. This enables process simplification through avoidance of intermediate sacrificial inorganic pattern transfer layers that would otherwise be used to supplement the patterned organic resists with respect to the mask function. Also, the coating material provides for convenient double patterning. Specifically, following a thermal treatment, condensed portions of the coating material that have been irradiated are stable with respect to contact with many composition including further precursor solutions. Thus, multiple patterning can be performed without removing previously deposited hard-mask coating materials.

The patterned inorganic coating material can be subsequently removed after the patterned material is used as a mask to pattern desired functional materials. Alternatively, the resulting patterned inorganic material can be incorporated into the structure as a component of the device(s). If the patterned inorganic coating material is incorporated into the structure, many steps of the processing procedure can be eliminated through the use of a direct patterning of the material with radiation. Alternatively, it has been found that very high resolution structures can be formed using thin inorganic coating materials exposed using short wavelength electromagnetic radiation and/or electron beams, and that line-width roughness can be reduced to very low levels for the formation of improved patterned structures.

The formation of integrated electronic devices and the like involves the patterning of the materials to form individual elements or components within the structures. Generally, this patterning involves different compositions covering portions of layers that interface with each other to induce desired functionality. The various materials can comprise semiconductors, which can have selected dopants, dielectrics, electrical conductors and/or other types of materials. To form high resolution patterns, radiation sensitive organic compositions can be used to introduce patterns, and the compositions can be referred to as resists since portions of the composition are processed to be resistant to development/etching such that selective material removal can be used to introduce a selected pattern. Radiation with the selected pattern or the negative of the pattern can be used to expose the resist and to form a pattern or latent image with developer resistant regions and developer dissolvable regions. The radiation sensitive inorganic compositions described herein can be used for the direct formation of desired inorganic material structures within the device and/or as a radiation patternable inorganic resist that is a replacement for an organic resist. In either case, significant processing improvements can be exploited, and the structure of the patterned material can be also improved.

To form the coating material, a precursor solution is applied to a surface of a substrate, such as a wafer or the like. In some embodiments, the inorganic precursor solution can have a relatively low concentration of metal ions such that the rheology of the coating composition, e.g., the viscosity, allows the formation of a thin coating on the substrate. The use of a thinner coating is consistent with the formation of higher resolution structures upon exposure to radiation and development of the pattern. The relatively high density and small spatial dimensions of the independently processable chemical moieties of the coating material can be exploited for the formation of structures with reduced line-width roughness, small feature sizes and/or extremely high resolution.

The coating materials described herein can be designed for use with particular radiation types, and the precursor solution can be correspondingly formulated to provide the desired coating material composition. In particular, the coating materials can be engineered to have a desired absorption of a selected radiation, and use of a coating material with a greater absorption cross section of the radiation allows for the corresponding use of a lower radiation dose. With appropriate selection of the composition, the patterning composition can be sensitive to, for example, ultraviolet light, x-rays or electron beams, as well as a particular wavelength or range of wavelengths within each radiation type. These particular radiation types are desirable due to the ability to form small patterns based on short radiation wavelengths. Thus, using the coating materials described herein, small patterns can be effectively formed with corresponding low line-width roughness that can enhance device formation abilities. Also, since the radiation patterned coating material is thin and has a high contrast with respect to sensitivity to appropriate developers, following removal of the un-irradiated coating material, the structures can have a small pitch between adjacent structures.

The precursor solution comprises an aqueous solution with metal suboxide cations, radiation sensitive ligands comprising peroxide groups, and polyatomic anions. Metal suboxide cations are polyatomic cations with a metal element and covalently bonded oxygen atoms. Aqueous solutions of metal suboxide or metal hydroxides can tend to be unstable with respect to gelling and/or precipitation. In particular, the solutions are unstable upon solvent removal and can form oxo-hydroxide networks with the metal cations. The precipitated materials though can have useful properties, as described below. The precursor solutions have been formulated with improved stability and control of the precipitation so that radiation can be used to induce a change in the material. In particular, peroxide-based ligands stabilize the precursor solutions while also providing control over the processing of the materials.

Specifically, the precursor solution can comprise sufficient radiation sensitive ligands such that the solution has a molar concentration ratio of radiation sensitive ligands to metal suboxide cations of at least about 2 and in some embodiments at least about 5. In particular, the higher peroxide-based ligand concentrations provide for a surprisingly large improvement in the precursor stability. While not wanting to be limited by theory, the increase in the radiation sensitive ligand concentration evidently reduces agglomeration of the metal cations to stabilize the solution. Thus, the precursor solution can be stable relative to settling of solids without further stirring for at least two hours and possibly for significantly longer periods of time, such as greater than a month. Due to the long stability times, the improved precursors have increased versatility with respect to potential commercial uses. Hydrogen peroxide provides a desirable radiation sensitive ligand, although other inorganic peroxides can be suitable. In some embodiments, an organic peroxide can be used, but generally the organic components should be removed thoroughly for the formation of the final product at least for some electronics applications.

Furthermore, it has been discovered that materials formed with metal suboxide cations and polyatomic anions can provide useful material properties, which make the materials suitable for components of electronic devices and the like. Additional metal cations and anions can be incorporated into the materials to adjust the properties. These general precursor solutions are described further in published PCT application WO 2009/120169 to Keszler et al., entitled "Solution Processed Thin Films and Laminates, Devices Comprising Such Thin Films and Laminates and Methods for the Use and Manufacture," incorporated herein by reference (hereinafter "Keszler PCT application"). As described herein, significant improvements in the precursor solutions have been accomplished through the use of significantly higher radiation sensitive ligand concentrations. Even more surprisingly, significantly increasing the radiation sensitive ligand concentration in the precursor solutions results in a coating material that has greater contrast following radiation exposure so that there are surprising added benefits where precursor solution stabilization further accomplishes improved patterning and shorter development times.

The metal suboxide cations can be selected to achieve the desired radiation absorption. In particular, $ZrO^{+2}$ based coating materials exhibit good absorption of far ultraviolet light at a 193 nm wavelength. $HfO^{+2}$ based coating materials exhibit good absorption of x-ray radiation and electron beam radiation and can also contribute desirable properties to the coating material, such as density and smoothness. Some precursor solutions effectively incorporate a blend of $ZrO^{+2}$ and $HfO^{+2}$ cations to provide for desirable overall properties of the coating materials. The precursor solutions can comprise additional metal cations to increase the absorption of some radiation wavelengths of significance for lithography. The metal cations can have various degrees of hydrolysis from interactions with water, and the state of hydrolysis with water generally is significantly pH dependent. The metal ion concentration can be selected to provide desired properties for the precursor solution, with more dilute solutions generally consistent with the formation of thinner coating materials.

Sulfate anions can be desirable polyatomic anions for incorporation in the precursor solutions, although other polyatomic anions can be desirable alternatives or additions to the sulfate anions. The concentration of polyatomic anions has been found to correlate with the sensitivity of the coating material to various developer compositions. Some polyatomic anions comprise metal atoms with covalent bonds with oxygen atoms and/or hydroxide groups, and anion structure can also be pH dependent.

Refined precursor solutions with greater stability also provide for a coating material having the potential of a greater contrast between the radiation exposed and unexposed portions of the substrate. Specifically, the un-irradiated coating material can be relatively more easily dissolved by suitable developer compositions while the exposed coating material can remain appropriately resistant to the developer composition. Since the un-irradiated coating material can be relatively more easily dissolvable with a developer in comparison with the irradiated coating material, the contact time with the developer can be reduced while still maintaining desired removal of the coating composition. Specifically, with the improved compositions and corresponding materials, line-width roughness has been reduced to surprisingly low levels. Correspondingly, the pitch can be made very small between adjacent elements with appropriate isolation, generally electrical isolation, between the adjacent elements. The irradiated coating composition can be very resistant to the development/etching process so that the coating composition can be made very thin without compromising the efficacy of the development process with respect to clean removal of the un-irradiated coating composition while leaving appropriate portions of the irradiated patterning composition on the surface of the substrate. The ability to shorten the exposure time to the developer further is consistent with the use of thin coatings without damaging the exposed portions of the coating.

To perform the patterning, the precursor solution is generally applied to the entire surface of the substrate or a selected portion thereof. The precursor composition can be deposited onto a substrate, for example, using conventional coating approaches. Prior to the application of the coating material, the substrate surface can be prepared using a hydrophilic surface treatment to increase the hydrophilic nature of the surface for improved wetting with the aqueous precursor solution. For example, precursor solutions can be coated onto wafers or other substrates using spin coating, although other coating approaches can be used, such as spray coating, knife edge coating or other appropriate techniques. Printing techniques, such as screen printing, inkjet printing and the like, can be used for applying the precursor solution. However, the fine patterning generally is performed with radiation based patterning rather than using printing. The removal of at least a portion of the solvent can stabilize the coating material for further processing. Solvent can be removed in part during the coating process itself. Also, the substrate with the coating material can be heated to contribute to the removal of solvent. Following the removal of sufficient solvent, the coating material is generally relatively stable to allow for the patterning and can be further processed for patterning.

The coating material generally is radiation sensitive such that exposure to radiation modifies the composition of the coating material at irradiated regions as a latent image. The radiation pattern can be introduced through the passage or reflection of the radiation through a physical mask and suitable optics can be used to deliver the patterned radiation to the coating material. Additionally or alternatively, a beam of radiation can be scanned across the coating material to form a pattern in the coating material as a latent image based on exposure to the radiation. The radiation absorption results in the condensation of the irradiated portion of the coating material. In other words, the energy from radiation absorption results in agglomeration of the metal ions to change the character of the irradiated material.

While not wanting to be limited by theory, it is believed that upon absorption of the radiation, the peroxide functional groups are fragmented, and the composition correspondingly condenses through the formation of bridging metal-oxygen bonds. Through the condensation reaction, the radiation pattern is transferred to a pattern in the coating material. Specifically, there is a pattern of irradiated, and correspondingly condensed, coating material and of un-irradiated coating material, which is substantially unchanged from its composition prior to patterned irradiation of the coating material.

It has been discovered that the contrast in material properties can be increased between the condensed coating composition and the un-irradiated coating composition through the heating of the material following irradiation. In particular, the heating process is found to increase the condensation of the irradiated coating composition. The heating does not significantly change the ability to remove the un-irradiated material in a development step.

The patterned coating composition can be exposed to a developer liquid, such as 2.38 weight percent tetramethyl ammonium hydroxide (the standard developer in semiconductor lithography), that removes the un-irradiated portion of the coating material. The development can be performed in a short period of time based on the appropriate selection of the developer composition. Furthermore, due to the stabilization of the condensed, irradiated coating material, the condensed coating material can be very stable against the developer. The condensed coating material forms a very hard masking material.

Following the patterning of the coating material, additional layers of material can be applied over the pattern and/or additional etching can be performed through the windows created by removing un-irradiated coating material to selectively remove substrate material based on the latent image in the patterned coating material. In this way, the patterned coating material can be used to assemble a structure with further complementary patterning of various compositions. Ions may also be selectively implanted into the substrate through the windows of the patterned coating material for control of electrical properties. The dense nature of the patterned inorganic coating provides a higher implantation resistance relative to a conventional organic patterned coating. Since the patterned coating material is itself an inorganic material that can incorporate desirable properties to a structure, the patterned coating material can be directly incorporated into a device. For embodiments in which the coating material is incorporated directly into the structure, distinct steps that just accomplish the patterning and removal of a resist are avoided such that very significant processing advantages can be achieved. These uses are elaborated on in the following discussion.

As noted above, the radiation sensitive coating materials described herein can be used as a negative resist. After developing the patterned coating material to remove the un-irradiated coating material, the pattern can be used for additional processing steps. In particular, the substrate may be etched through the gaps in the patterned coating. Furthermore, additional materials can be deposited with the additional materials penetrating through the gaps in the patterned coating material to reach the underlying substrate. In some embodiments, combinations of etching and/or deposition can be based on the pattern in the coating material. After the additional processing is performed based on the patterned coating material, the inorganic coating material, i.e., inorganic resist, can be removed using a suitable etching composition or other etching process. For example, the irradiated coating material can be removed with a dry $BCl_3$ plasma etch or an aqueous HF wet etch. The use of similar compositions as a negative resist as well as some embodiments of a positive resist is described in the Keszler PCT application, which has been incorporated herein by reference. Relative to organic resists, the inorganic coating material provides distinct advantages with respect to absorption of selected radiation as well as high contrast between exposed and non-exposed regions such that high resolution can be achieved with moderate radiation doses.

The direct use of a patterned radiation-sensitive inorganic coating material provides the ability to form a patterned inorganic layer without the separate use of an organic resist. The large contrast in properties between the irradiated and non-irradiated regions of the inorganic coating material provides for the ability to form thin patterned layers in which the non-irradiated portion can be cleanly removed without significantly damaging the resistant condensed portions of the coating material during the development process. Due to the density and general etch resistance of the patterned inorganic coating material, the thin patterned coating material can be effectively used for further processing of the structure including, for example, etching and ion implantation, that is guided by the patterned inorganic coating material as a mask. In some embodiments, the condensed inorganic coating material can be designed with an appropriate thickness and physical properties to be directly incorporated into the device as a functional element. For example, the product metal suboxide compositions can be used as dielectrics, as described in published U.S. patent application 2005/0242330A to Herman et al., entitled "Dielectric Material," incorporated herein by reference. Also, some embodiments of the metal suboxide compositions exhibit semiconducting properties as described in published U.S. patent application 2010/0044698A to Herman et al., entitled "Semiconductor Film Composition," incorporated herein by reference. Thus, the coating materials can be selected to have appropriate functionality.

The general uses of lithographic procedures are well known in the electronics art. See, for example, U.S. Pat. No. 7,208,341 to Lee et al., entitled "Method for Manufacturing Printed Circuit Board," Harry J. Levinson, "Principles of Lithography," 2nd Edition, SPIE Press, Monograph Vol. PM146 (2005), and Chris Mack, "Fundamental Principles of Optical Lithography, The Science of Microfabrication," Willey-Interscience (2007), all three of which are incorporated herein by reference. Generally, the substrate is a single crystal silicon wafer, which may include other layers, although other substrates, such as polymers, can be used. In particular, the processing temperatures for the inorganic coating materials described herein are relatively low, so that the formation of patterned inorganic materials as described herein can be performed with very high resolution on substrates that may not be able to be processed without damage at higher temperatures, such as above 600° C. Suitable devices in which elements can be patterned using the inorganic coating materials described herein include, for example, integrated electronic circuits, solar cells, electronic displays and the like.

Precursor Solutions

The precursor solutions have been formulated to achieve very high levels of stability such that the precursor solutions have appropriate shelf lives for commercial products. Also, it has been discovered that the formulation of the precursor solutions can be designed to achieve desired levels of radiation absorption for a selected radiation based on the selection of the metal cations. The precursor solutions are based on metal oxide chemistry and aqueous solutions of metal cations with polyatomic anions. The precursor solutions are designed to form a coating composition upon at least partial solvent removal and ultimately an inorganic solid with metal oxides and polyatomic anions. The control of the precursor solution is based on high concentrations of radiation sensitive ligands to the metal cations, specifically peroxide-based ligands. In particular, if the mole ratio of peroxide groups to the metal cations is at least 2, more stable solutions can be formed. The more stable precursor solutions provide an added advantage of greater contrast between the ultimate irradiated coating material and un-irradiated coating material.

The aqueous precursor solutions generally comprise one or more metal cations. In aqueous solutions, metal cations are hydrated due to interactions with the water molecules. The nature of the interactions is generally pH dependent. Specifically, hydrolysis can take place to bond oxygen atoms to the metal ion to form hydroxide ligands or oxo bonds with the corresponding release of hydrogen ions. As additional hydrolysis takes place, the solutions can become unstable with respect to precipitation of the metal oxide or with respect to gelation. Ultimately, it is desirable to form the oxide material, but this progression to the oxide is controlled as part of the procedure for processing the solution first to a coating material and then to the ultimate metal oxide composition with polyatomic anions. Solvent removal can contribute to the formation of the oxide, but this approach does not provide significant control of the process without the use of the peroxide-based ligands as described herein. As described below, peroxide-based ligands can be used to provide significant control to the processing of the solution.

Thus, the aqueous solutions of the metal cations are poised for further processing. In particular, it can be desirous to use as an added component of the precursor solution, a metal suboxide cation that can poise the solution further toward a metal oxide composition. In general, the precursor solution comprises from about 0.01M to about 1.4M metal suboxide cation, in further embodiments from about 0.05M to about 1.2M, and in additional embodiments from about 0.1M to about 1.0M. A person of ordinary skill in the art will recognize that additional ranges of metal suboxide cations within the explicit ranges above are contemplated and are within the present disclosure. The metal suboxides can be added as suitable salts, such as halides salts, e.g., chlorides, fluorides, bromides, iodides or combinations thereof. Based on the use of the metal suboxide ions in the precursor solutions, relatively low levels of heating can be used to form the oxides while maintaining good control of the solutions based on the use of the radiation sensitive ligands.

Various metal ions can be provided as metal suboxide cations, such as $VO^{+2}$, $SbO^+$, $ReO_3^+$, $TiO^{+2}$, $TaO^{+3}$, $TaO_2^+$, $YO^+$, $NbO^{+2}$, $MoO^{+2}$, $WO^{+4}$, $WO_2^{+2}$, $AlO^+$, $GaO^+$, $CrO^+$, $FeO^+$, $BiO^+$, $LaO^+$, $CeO^+$, $PrO^+$, $NdO^+$, $PmO^+$, $SmO^+$, $EuO^+$, $GdO^+$, $TbO^+$, $DyO^+$, $HoO^+$, $ErO^+$, $TmO^+$, $YbO^+$, $LuO^+$, $TiO_y(OH)_z^{(4-2y-z)+}$, $TaO_y(OH)_z^{(5-2y-z)+}$, $YO_y(OH)_z^{(3-2y-z)+}$, $NbO_y(OH)_z^{(4-2y-z)+}$, $MoO_y(OH)_z^{(4-2y-z)+}$, $WO_y(OH)_z^{(6-2y-z)+}$, $AlO_y(OH)_z^{(3-2y-z)+}$, $GaO_y(OH)_z^{(3-2y-z)+}$, $Zn(OH)^+$, $CrO_y(OH)_z^{(3-2y-z)+}$, $FeO_y(OH)_z^{(3-2y-z)+}$, $BiO_y(OH)_z^{(3-2y-z)+}$, $LaO_y(OH)_z^{(3-2y-z)+}$, $CeO_y(OH)_z^{(3-2y-z)+}$, $PrO_y(OH)_z^{(3-2y-z)+}$, $NbO_y(OH)_z^{(3-2y-z)+}$, $PmO_y(OH)_z^{(3-2y-z)+}$, $SmO_y(OH)_z^{(3-2y-z)+}$, $EuO_y(OH)_z^{(3-2y-z)+}$, $GdO_y(OH)_z^{(3-2y-z)+}$, $TbO_y(OH)_z^{(3-2y-z)+}$, $DyO_y(OH)_z^{(3-2y-z)+}$, $HoO_y(OH)_z^{(3-2y-z)+}$, $ErO_y(OH)_z^{(3-2y-z)+}$, $TmO_y(OH)_z^{(3-2y-z)+}$, $YbO_y(OH)_z^{(3-2y-z)+}$, $LuO_y(OH)_z^{(3-2y-z)+}$, or combinations thereof. The y and z parameters can be selected such that the ions have a positive charge based on the particular oxidation state of the metal atom. Metal suboxide cations of particular interest include, for example, $ZrO^{+2}$, $ZrOOH^+$, $Zr(OH)_2^{+2}$, $Zr(OH)_3^+$, $HfO^{+2}$, $HfOOH^+$, $Hf(OH)_2^{+2}$, $Hf(OH)_3^+$ combinations thereof and/or combinations with other metal suboxide cations. Furthermore, the solution can comprise additional metal cations, such as cations of copper, hafnium ($Hf^{+4}$), titanium ($Ti^{+4}$), zirconium ($Zr^{+4}$), cerium ($Ce^{+4}$), tin ($Sn^{+4}$), tantalum ($Ta^{+5}$), niobium ($Nb^{+4}$), yttrium ($Y^{+3}$), molybdenum ($Mo^{+6}$), tungsten ($W^{+6}$), aluminum ($Al^{+3}$), gallium ($Ga^{+3}$), zinc ($Zn^{+2}$), chromium ($Cr^{+3}$), iron ($Fe^{+3}$), bismuth ($Bi^{+3}$), scandium ($Sc^{+3}$), vanadium ($V^{+4}$), manganese ($Mn^{+2}$, $Mn^{+3}$, $Mn^{+4}$), cobalt ($Co^{+2}$, $Co^{+3}$), nickel ($Ni^{+2}$, $Ni^{+3}$), indium ($In^{+3}$), antimony ($Sb^{+5}$), iridium ($Ir^{+3}$, $Ir^{+4}$), platinum ($Pt^{+2}$, $Pt^{+4}$), lanthanum ($La^{+3}$), praseodymium ($Pr^{+3}$), neodymium ($Nd^{+3}$), promethium ($Pm^{+3}$), samarium ($Sm^{+3}$), europium ($Eu^{+3}$), gadolinium ($Gd^{+3}$), terbium ($Tb^{+3}$), dysprosium ($Dy^{+3}$), holmium ($Ho^{+3}$), erbium ($Eb^{+3}$), thulium ($Tm^{+3}$), ytterbium ($Yb^{+3}$), lutetium ($Lu^{+3}$) or combinations thereof. As noted above, the state of the cations in solution is pH dependent, such that the initial state of oxygen coordination can change in solution, but the trend is toward hydrolysis leading to oxide formation. It has been found that peroxide-based ligands can hinder the formation of a metal-oxygen network that leads to gelation and ultimately precipitation. Thus, the peroxide can be used to form a stable state that can be quickly condensed upon rupture of the peroxide bonds.

The metal cations generally significantly influence the absorption of radiation. Therefore, the metal cations can be selected based on the desired radiation and absorption cross section. It has been found that $ZrO^{+2}$ provides good absorption of ultraviolet light at 193 nm wavelength and other far ultraviolet radiation. $HfO^{+2}$ provides good absorption of electron beam material and extreme UV radiation. Further tuning of the composition for radiation absorption can be adjusted based on the addition of other metal ions. For example, one or more ions (cations or anions) comprising titanium, zinc, calcium, indium, tin, antimony, bismuth or combinations thereof can be added to the precursor solution to form a coating material with an absorption edge moved to longer wavelengths, to provide, for example, sensitivity to 248 nm wavelength ultraviolet light. Also, one or more ions (cations or anions) comprising magnesium, boron, calcium, aluminum, silicon, phosphorous or combinations thereof can be used to increase the absorption cross section at shorter wavelengths. The energy absorbed is transferred to the peroxide ligand which can result in the rupturing of the peroxide bond, which provides desired control over the material properties.

The precursor solutions can also comprise polyatomic anions, which are generally oxygen based. Through the formation of an ultimate inorganic oxide, oxygen-based polyatomic anions can carry over into the oxide within an ultimate solid material. As with the cations, the nature of the anions can be pH dependent. Suitable oxygen-based polyatomic anions include, for example, $SO_4^{-2}$, $BO_3^{-3}$, $AsO_4^{-3}$, $MoO_4^{-2}$, $PO_4^{-3}$, $WO_4^{-2}$, $SeO_4^{-2}$, $SiO_4^{-4}$, their protonated forms, and combinations thereof. Generally, the precursor solution comprises a polyatomic anion concentration from about 0.5 to about 2.0 times the metal suboxide cation concentration, in other embodiments from about 0.75 to about 1.5 times the metal suboxide cation concentration, and in further embodiments from about 0.8 to about 1.3 times the metal suboxide cation concentration. A person of ordinary skill in the art will recognize that additional ranges of anion concentrations within the explicit ranges above are contemplated and are within the present disclosure. The polyatomic anions can be added as an acid if the pH adjustment is suitable, and/or the polyatomic anions can be added along with a desired metal cation. The precursor solution can generally be prepared with additional anions, such as halide anions, which may be added with the metal suboxide cations. Halide anions may react with the peroxide ligands to form halogen molecules, such as $Cl_2$, $Br_2$, or $I_2$. The reaction with halide ions reduces the peroxide concentrations a modest amount relative to the added amounts of peroxide.

The peroxide-based ligands stabilize the composition with respect to condensation. In particular, at high relative concentration of peroxide-based ligands, significant amounts of water can be removed from the composition without forming a condensed metal oxide or metal hydroxide. Based on the discovery of this stabilization property, solutions can be formed with high concentrations of radiation sensitive ligands that have good shelf stability while retaining convenient processing to form coatings. Radiation sensitive ligands of particular interest have a peroxide group, —O—O—. As noted above in the context of FIG. 1, energy from absorbed radiation can break the oxygen-oxygen bond. As the peroxide groups are broken, the corresponding stabilization is lost, as the composition condenses with the formation of M-O-M bonds, where M represents a metal atom. Thus, the condensation can be controlled with radiation. Compositions with high radiation sensitive ligand concentrations can be highly stable with respect to the avoidance of spontaneous condensation.

The chemically simplest ligand composition would be hydrogen peroxide, $H_2O_2$, which is soluble in water. Additional peroxide-based ligands include, for example, organic compositions and/or inorganic compositions. In some embodiments, inorganic peroxide-based ligands can be desirable since carbon can be disadvantageous for many devices. If an inorganic peroxide is used as a radiation sensitive ligand, the risk of carbon contamination from the radiation sensitive ligand is avoided. Suitable inorganic peroxide ligands include, for example, peroxysulfate ($SO_4H^-$), peroxydisulfate ($S_2O_8^{-2}$), peroxychlorates ($ClO_4H^-$), or the like or combinations thereof. The precursor composition generally comprises a ligand concentration of at least a factor of about 2 times the metal cation concentration, in further embodiments at least a factor of about 3, in other embodiments at least a factor of about 4 and in additional embodiments a factor from about 5 to about 25 times the metal cation concentration.

In general, the desired compounds are dissolved to form an aqueous solution. After the components of the solution are dissolved and combined, the character of the species may change as a result of hydration and peroxide-based ligand binding. When the composition of the solution is referenced herein, the reference is to the components as added to the solution since the nature of the species in solution may not be well known.

In some embodiments, it may be desirable to form separate solutions that can be combined to form the precursor solution from the combination. Specifically, separate solutions can be formed comprising one or more of the following: the metal suboxide cations, any additional metal cations, the peroxide-based ligands and the polyatomic anions. If multiple metal cations are introduced, the multiple metal cations can be introduced into the same solution and/or in separate solutions. Generally, the separate solutions can be well mixed. In some embodiments, the metal cation solution is then mixed with the peroxide-based ligand solution such that the peroxide-based ligand can conjugate with the metal cations. The resulting solution can be referred to as a stabilized metal cation solution. In some embodiments, the stabilized metal cation solution is allowed to stabilize for at least about five minutes and in further embodiments at least about 15 minutes prior to further processing. The polymeric anion solution can be added to the stabilized metal cation solution to form the stabilized precursor solution. This order of combining the solutions can lead to more desirable results in some embodiments of the precursor solution. The solutions can be combined under appropriate mixing conditions and at appropriate rates to achieve good mixing.

The concentrations of the species in the precursor solutions can be selected to achieve desired properties of the solution. In particular, lower concentrations overall can result in a desirable properties of the solution for certain coating approaches, such as spin coating, can achieve thinner coatings using reasonable coating parameters. In general, the concentration can be selected to be appropriate for the selected coating approach. As noted above, a relatively large ratio of peroxide-based ligand relative to the metal cations can be used to greatly stabilize the precursor solutions. Stability of the precursor solutions can be evaluated with respect to changes relative to the initial solution. Specifically, a solution has lost stability if a phase separation occurs with the production of large sol particles. Based on the improved stabilization approaches described herein, the solutions can be stable for at least about 2 hours without additional mixing, in further embodiments at least about 1 day, in other embodiments at least about 5 days and in additional embodiments at least about 25 days. A person of ordinary skill in the art will recognize that additional ranges of stabilization times are contemplated and are within the present disclosure. The solutions can be formulated with sufficient stabilization times that the solutions can be commercially distributed with appropriate shelf lives.

Coating Material

A coating material is formed through the deposition of the precursor solution onto a selected substrate. A substrate generally presents a surface onto which the coating material can be deposited, and the substrate may comprise a plurality of layers in which the surface relates to an upper most layer. The substrate surface can be treated to prepare the surface for adhesion of the coating material. Prior to preparation of the surface, the surface can be cleaned and/or smoothed as appropriate. Suitable substrate surfaces can comprise any reasonable material. Some substrates of particular interest include, for example, silicon wafers, silica substrates, other inorganic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the patternable inorganic materials described herein. Suitable polymers can include, for example, polycarbonates, polyimides, polyesters, polyalkenes, copolymers thereof and mixtures thereof. In general, it is desirable for the substrate to have a flat surface, especially for high resolution applications.

Traditional organic resists are soluble in nonpolar solvents and are deposited onto hydrophobic surfaces. The surfaces can be treated with compounds, such as hexamethyldisilazane (HMDS), to render the surfaces hydrophobic and to promote adhesion of polymer resists. In contrast, the inorganic patternable coating materials described herein are based on aqueous solutions, which suggests that it may be desirable to apply the solution to a hydrophilic surface for application to the substrate surface. Suitable methods can be used for particular substrate compositions to render the substrate hydrophilic, if the surface is not initially hydrophilic to a desired degree. For silicon substrates, a variety of methods can be used to render the surface hydrophilic including, but not limited to, soak in a basic detergent, oxygen plasma treatment, UV ozone treatment, soaking in a piranha etchant (3:1 mixture of concentrated $H_2SO_4$(aq) and 30% by weight $H_2O_2$(aq)), and treating with dimethylsulfoxide (DMSO) followed by heating at about 225° C. to about 275° C. for up to about 5 minutes.

In general, any suitable coating process can be used to deliver the precursor solution to a substrate. Suitable coating approaches can include, for example, spin coating, spray coating, dip coating, knife edge coating, printing approaches, such as inkjet printing and screen printing, and the like. Some of these coating approaches form patterns of coating material during the coating process, although the resolution available currently from printing or the like has a significantly lower level of resolution than available from radiation based patterning as described herein. The coating material can be applied in multiple coating steps to provide greater control over the coating process. For example, multiple spin coatings can be performed to yield an ultimate coating thickness desired. The heat processing described below can be applied after each coating step or after a plurality of coating steps.

If patterning is performed using radiation, spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge beam removal step or the like can be performed with water or other suitable rinse to remove any edge bead. A person or ordinary skill in the art will recognize that additional ranges of spin coating parameters within the explicit ranges above are contemplated and are within the present disclosure.

The thickness of the coating generally can be a function of the precursor solution concentration, viscosity and the spin speed. For other coating processes, the thickness can generally also be adjusted through the selection of the coating parameters. In some embodiments, it can be desirable to use a thin coating to facilitate formation of small and highly resolved features. In some embodiments, the coating materials can have an average thickness of no more than about 1 micron, in further embodiments no more than about 250 nanometers (nm), in additional embodiments from about 1 nanometers (nm) to about 50 nm, in other embodiments from about 1 nm to about 40 nm and in some embodiments from about 1 nm to about 25 nm. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film.

The coating process itself can result in the evaporation of a portion of the solvent since many coating processes form droplets or other forms of the coating material with larger surface areas and/or movement of the solution that stimulates evaporation. The loss of solvent tends to increase the viscosity of the coating material as the concentration of the species in the material increases. In general, the coating material can be heated prior to radiation exposure to further drive off solvent and promote densification of the coating material. As a result of the heat treatment and densification of the coating material, the coating material can exhibit an increase in index of refraction and in absorption of radiation without significant loss of contrast as a result of thermal decomposition of the peroxide groups.

An objective during the coating process can be to remove sufficient solvent to stabilize the coating material for further processing. The solvent removal process may not be quantitatively controlled with respect to specific amounts of solvent remaining in the coating material, and empirical evaluation of the resulting coating material properties generally can be performed to select processing conditions that are effective for the patterning process. While heating is not needed for successful application of the process, it can be desirable to heat the coated substrate to speed the processing and/or to increase the reproducibility of the process. In embodiments in which heat is applied to remove solvent, the coating material can be heated to temperatures from about 45° C. to about 150° C., in further embodiments from about 50° C. to about 130° C. and in other embodiments from about 60° C. to about 110° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure.

Patterned Exposure And Patterned Coating Material

The coating material can be finely patterned using radiation. As noted above, the composition of the precursor solution and thereby the corresponding coating material can be designed for sufficient absorption of a desired form of radiation. The absorption of the radiation results in transfer of energy that breaks the peroxide —O—O— bonds so that at least some of the peroxide-based ligands are no longer available to stabilize the material. With the absorption of a sufficient amount of radiation, the exposed coating material condenses. The radiation generally can be delivered according to a selected pattern. The radiation pattern is transferred to a corresponding pattern or latent image in the coating material with irradiated areas and un-irradiated areas. The irradiated areas comprise condensed coating material, and the un-irradiated areas comprise generally the as-formed coating material. As noted below, very sharp edges can be formed upon development of the coating material with the removal of the un-irradiated coating material.

Radiation generally can be directed to the coated substrate through a mask or a radiation beam can be controllably scanned across the substrate. In general, the radiation can comprise electromagnetic radiation, an electron beam (beta radiation), or other suitable radiation. In general, electromagnetic radiation can have a desired wavelength or range of wavelengths, such as visible radiation, ultraviolet radiation or x-ray radiation. The resolution achievable for the radiation pattern is generally dependent on the radiation wavelength, and a higher resolution pattern generally can be achieved with shorter wavelength radiation. Thus, it can be desirable to use ultraviolet light, x-ray radiation or an electron beam to achieve particularly high resolution patterns.

Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. A 193 nm line from an argon fluoride laser can be used as a radiation source in the FUV. EUV light has been used for lithography at 13.5 nm, and this light is generated from a Xe or Sn plasma source excited using high energy lasers or discharge pulses. Soft x-rays can be defined from greater than or equal 0.1 nm to less than 10 nm.

The amount of electromagnetic radiation can be characterized by a fluence or dose which is obtained by the integrated radiative flux over the exposure time. Suitable radiation fluences can be from about 1 mJ/cm$^2$ to about 150 mJ/cm$^2$, in further embodiments from about 2 mJ/cm$^2$ to about 100 mJ/cm$^2$ and in further embodiments from about 3 mJ/cm$^2$ to about 50 mJ/cm$^2$. A person of ordinary skill in the art will recognize that additional ranges of radiation fluences within the explicit ranges above are contemplated and are within the present disclosure.

With electron beam lithography, the electron beam generally induces secondary electrons which generally modify the irradiated material. The resolution can be a function at least in part of the range of the secondary electrons in the material in which a higher resolution is generally believed to result from a shorter range of the secondary electrons. Based on high resolution achievable with electron lithography using the inorganic coating materials described herein, the range of the secondary electrons in the inorganic material is limited. Electron beams can be characterized by the energy of the beam, and suitable energies can range from about 5 eV to about 200 keV and in further embodiments from about 7.5 eV to about 100 keV. Proximity-corrected beam doses at 30 keV can range from about 0.1 microcoulombs per centimeter squared ($\mu$C/cm$^2$) to about 5 millicoulombs per centimeter squared (mC/cm$^2$), in further embodiments from about 0.5 $\mu$C/cm$^2$ to about 1 mC/cm$^2$ and in other embodiments from about 1 $\mu$C/cm$^2$ to about 100 $\mu$C/cm$^2$. A person of ordinary skill in the art can compute corresponding doses at other beam energies based on the teachings herein and will recognize that additional ranges of electron beam properties within the explicit ranges above are contemplated and are within the present disclosure.

Following exposure with radiation, the coating material is patterned with irradiated regions and un-irradiated regions. Referring to FIGS. 2 and 3, a patterned structure 100 is shown comprising a substrate 102, a thin film 103 and patterned coating material 104. Patterned coating material 104 comprises condensed regions 110, 112, 114, 116 of irradiated coating material and regions and uncondensed regions 118, 120 of un-irradiated coating material. The patterned formed by condensed regions 110, 112, 114, 116 and uncondensed regions 118, 120 represent a latent image in to the coating material.

Based on the design of the inorganic coating material, there is a large contrast of material properties between the irradiated regions that have condensed coating material and the un-irradiated, uncondensed coating material. It has been surprisingly found that the contrast can be improved with a post-irradiation heat treatment, although satisfactory results can be achieved in some embodiments without post-irradiation heat treatment. The post-exposure heat treatment seems to anneal the irradiated coating material to improve its condensation without significantly condensing the un-irradiated regions of coating material based on thermal decomposition of the peroxide. For embodiments in which the heat treatment is used, the post-irradiation heat treatment can be performed at temperatures from about 45° C. to about 150° C., in additional embodiments from about 50° C. to about 130° C. and in further embodiments from about 60° C. to about 110° C. The heating for solvent removal can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. This high contrast in material properties further facilitates the formation of sharp lines in the pattern following development as described in the following section.

Development and Patterned Structure

Development of the image involves the contact of the patterned coating material including the latent image to a developer composition to remove the un-irradiated coating material. Referring to FIGS. 4 and 5, the latent image of the structure shown in FIGS. 2 and 3 has been developed through contact with a developer to form patterned structure 130. After development of the image, substrate 102 is exposed along the top surface through openings 132, 134. Openings 132, 134 are located at the positions of uncondensed regions 118, 120, respectively.

In general, the developer can be aqueous acids or bases. Generally, aqueous bases can be used to obtain sharper images. To reduce contamination from the developer, it can be desirable to use a developer that does not have metal atoms. Thus, quaternary ammonium hydroxide compositions, such as tetraethylammonium hydroxide, tetrapropylammonium hydroxide, tetrabutylammonium hydroxide or combinations thereof, are desirable as developers. In general, the quaternary ammonium hydroxides of particular interest can be represented with the formula $R_4NOH$, where R=a methyl group, an ethyl group, a propyl group, a butyl group, or combinations thereof. The inorganic coating materials generally can be developed with the same developer commonly used presently for polymer resists, specifically tetramethyl ammonium hydroxide (TMAH). Commercial TMAH is available at 2.38 weight percent, and this concentration can be used for the processing described herein. However, in some embodiments for the development of the inorganic materials, the developer can be delivered at higher concentrations relative to the concentrations generally used for the development of organic resists, such as 25% by weight TMAH. Furthermore, mixed quaternary tetraalkylammonium hydroxides can be selected to provide improved line edge profiles based on empirical evaluation. In general, the developer can comprise from about 2 to about 40 weight percent, in further embodiments from about 3 to about 35 weight percent and in other embodiments from about 4 to about 30 weight percent tetra-alkylammonium hydroxide. A person of ordinary skill in the art will recognize that additional ranges of developer concentrations within the explicit ranges above are contemplated and are within the present disclosure.

In addition to the primary developer composition, the developer can comprise additional compositions to facilitate the development process. Suitable additives include, for example, dissolved salts with cations selected from the group consisting of ammonium, d-block metal cations (hafnium, zirconium, lanthanum, or the like), f-block metal cations (cerium, lutetium or the like), p-block metal cations (aluminum, tin, or the like), alkali metals (lithium, sodium, potassium or the like), and combinations thereof, and with anions selected from the group consisting of fluoride, chloride, bromide, iodide, nitrate, sulfate, phosphate, silicate, borate, peroxide, butoxide, formate, ethylenediamine-tetraacetic acid (EDTA), tungstate, molybdate, or the like and combinations thereof. If the optional additives are present, the developer can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure. The additives can be selected to improve contrast, sensitivity and line width roughness. The additives in the developer can also inhibit formation and precipitation of $HfO_2/ZrO_2$ particles.

With a weaker developer, e.g., lower concentration developer, a higher temperature development process can be used to increase the rate of the process. With a stronger developer, the temperature of the development process can be lower to reduce the rate and/or control the kinetics of the development. In general, the temperature of the development can be adjusted between the appropriate values of an aqueous solvent. Additionally, developer with dissolved inorganic coating material near the developer-coating interface can be dispersed with ultrasonication during development.

The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired spin rinsing and/or drying can be used to complete the development process. Suitable rinsing solutions include, for example, ultrapure water, methyl alcohol, ethyl alcohol, propyl alcohol and combinations thereof. After the image is developed, the coating material is disposed on the substrate as a pattern.

After completion of the development step, the coating materials can be heat treated to further condense the material and to further dehydrate the material. This heat treatment can be particularly desirable for embodiments in which the inorganic coating material is incorporated into the ultimate device, although it may be desirable to perform the heat treatment for some embodiments in which the inorganic coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material can be heated to a temperature from about 150° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. A person of ordinary skill in the art will recognize that additional ranges of temperatures and time for the heat treatment within the explicit ranges above are contemplated and are within the present disclosure.

With organic resists, structures are susceptible to pattern collapse if the aspect ratio, height divided by width, of a structure becomes too large. Pattern collapse can be associated with mechanical instability of a high aspect ratio structure such that forces, e.g., surface tension, associated with the processing steps distort the structural elements.

Low aspect ratio structures are more stable with respect to potential distorting forces. With the patternable inorganic materials described herein, due to the ability to process effectively the structures with thinner layers of coating material, improved patterning can be accomplished without the need for high aspect ratio patterned coating material. Thus, very high resolution features have been formed without resorting to high aspect ratio features in the patterned coating material.

The resulting structures can have sharp edges with very low line-width roughness. In particular, in addition to the ability to reduce line-width roughness, the high contrast also allows for the formation of small features and spaces between features as well as the ability to form very well resolved two-dimensional patterns (e.g., sharp corners). Thus, in some embodiments, adjacent linear segments of neighboring structures can have an average pitch of no more than about 60 nm, in some embodiments no more than about 50 nm and in further embodiments no more than about 40 nm. Pitch can be evaluated by design and confirmed with scanning electron microscopy (SEM), such as with a top-down image. As used herein, pitch refers to the spatial period, or the center-to-center distances of repeating structural elements. Feature dimensions of a pattern can also be described with respect to the average width of the feature, which is generally evaluated away from corners or the like. Also, features can refer to gaps between material elements and/or to material elements. In some embodiments, average widths can be no more than about 30 nm, in further embodiments no more than about 25 nm, and in additional embodiments no more than about 20 nm. Average line-width roughness can be no more than about 2.25 nm, and in further embodiments from about 1.2 nm to about 2.0 nm. Evaluating line-width roughness is performed by analysis of top-down SEM images to derive a 3σ deviation from the mean line-width. The mean contains both high-frequency and low-frequency roughness, i.e., short correlation lengths and long correlation lengths, respectively. The line-width roughness of organic resists is characterized primarily by long correlation lengths, while the present inorganic coating materials exhibit significantly shorter correlation lengths. In a pattern transfer process, short correlation roughness can be smoothed during the etching process, producing a much higher fidelity pattern. A person of ordinary skill in the art will recognize that additional ranges of pitch, average widths and line-width roughness within the explicit ranges above are contemplated and are within the present disclosure.

Further Processing of Patterned Coating Material

After forming a patterned coating material, the coating material can be further processed to facilitate formation of the selected devices. Furthermore, further material deposition and/or patterning generally can be performed to complete structures. The coating material may or may not ultimately be removed. The quality of the patterned coating material can in any case be carried forward for the formation of improved devices, such as devices with smaller foot prints and the like.

Figure 6:
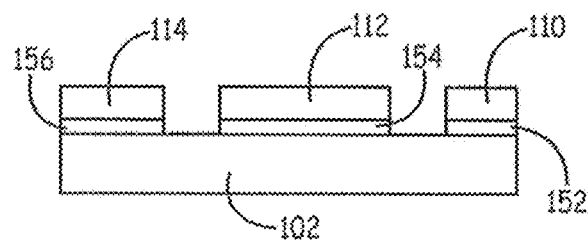
FIG. 6 is a side plan view of the patterned structure of FIGS. 4 and 5 following etching of the underlayer.

The patterned coating material forms openings to the underlying substrate, as shown for example in FIGS. 4 and 5. As with conventional resists, the patterned coating material forms an etch mask which can be used to transfer the pattern to selectively remove an underlying thin film. Referring to FIG. 6, underlying thin film 103 is patterned leaving features 152, 154, 156 respectively under condensed regions 110, 112, 114. Compared with conventional polymer resists, the materials described herein can provide significantly greater etch resistance.

Alternatively or additionally, the deposition of a further material can alter the properties of the underlying structure and/or provide contact to the underlying structure. The further coating material can be selected based on the desired properties of the material. In addition, ions can be selectively implanted into the underlying structure, as the density of the patterned inorganic coating material can provide a high implant resistance. In some embodiments, the further deposited material can be a dielectric, a semiconductor, a conductor or other suitable material. The further deposited material can be deposited using suitable approaches, such as solution based approaches, chemical vapor deposition (CVD), sputtering, physical vapor deposition (PVD), or other suitable approach.

In general, a plurality of additional layers can be deposited. In conjunction with the deposition of a plurality of layers, additional patterning can be performed. Any additional patterning, if performed, can be performed with additional quantities of the coating materials described herein, with polymer-based resists, with other patterning approaches or a combination thereof.

As noted above, a layer of coating material following patterning may or may not be removed. If the layer is not removed, the patterned coating material is incorporated into the structure. For embodiments in which the patterned coating material is incorporated into the structure, the properties of the coating material can be selected to provide for desired patterning properties as well as also for the properties of the material within the structure.

Figure 7:
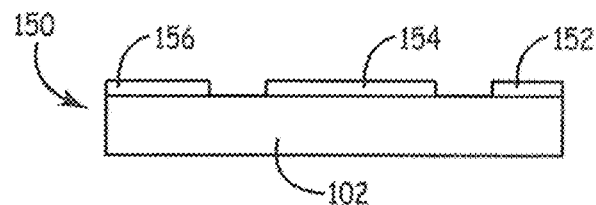
FIG. 7 is a side plan view of the structure of FIG. 6 following etching to remove the patterned, condensed coating material.

If it is desired to remove the patterned coating material, the coating material functions as a resist. The patterned coating material is used to pattern a subsequently deposited material prior to the removal of the resist/coating material and/or to selectively etch the substrate through the spaces in the condensed coating material. The coating material can be removed using a suitable etching process. Specifically, to remove the condensed coating material, a dry etch can be performed, for example, with a $BCl_3$ plasma, $Cl_2$ plasma, HBr plasma, Ar plasma or plasmas with other appropriate process gases. Alternatively or additionally, a wet etch with, for example, HF(aq) or buffered HF(aq)/$NH_4F$ can be used to remove the patterned coating material. Referring to FIG. 7, the structure of FIG. 6 is shown after removal of the coating material. Etched structure 150 comprises substrate 102 and features 152, 154, 156.

Figure 8:
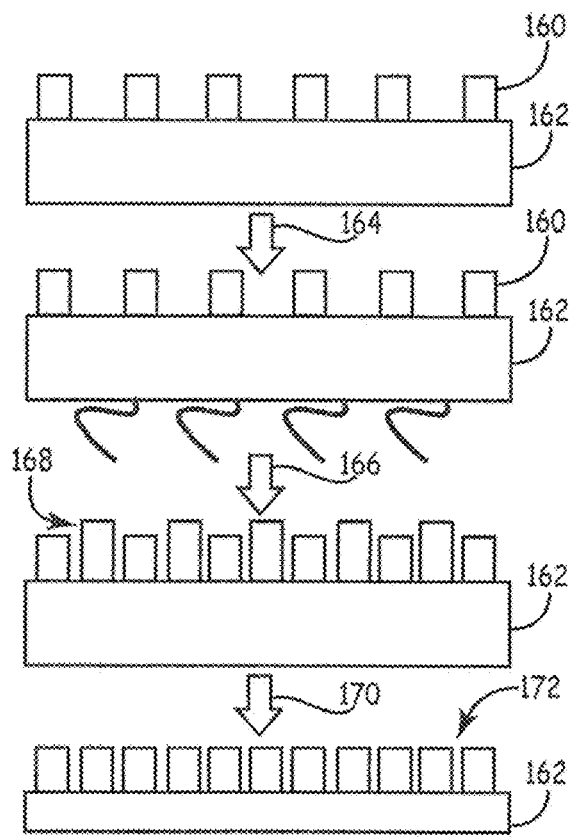
FIG. 8 is a side plan view of a "thermal freeze" double patterning process flow. The process shown in FIGS. 2-4 is repeated after a bake that renders the first layer insoluble to the second layer.

The coating materials are particularly convenient for performing multiple patterning using a thermal freeze process, as described generally with conventional resists in P. Zimmerman, J. Photopolym. Sci. Technol., Vol. 22, No. 5, 2009, p. 625. A double patterning process with a "thermal freeze" is outlined in FIG. 8. In the first step, the coating material is formed into a pattern 160 on substrate 162 using a lithographic process and development as described with respect to FIGS. 4 and 5. A heating step 164 is performed to dehydrate the coating material. This heating step is equivalent to the post-development heating step described in the Development section above. This "thermal freeze" process makes the coating material insoluble to a subsequent deposition of a second layer of the coating material. A second lithographic and development step 166 is performed to form a double patterned structure 168 on substrate 162. After an etch step 170, the product double patterned structure 172 is formed. Note that it is straightforward to extend this process to multiple coat and pattern steps, and such extensions are contemplated and are within the present disclosure. With respect to multiple patterning, a significant difference between the inorganic coating materials described herein and conventional organic resists is that organic resists remain soluble in conventional resist casting solvents even after a thermal bake. The resist materials described herein can be dehydrated with a thermal bake such that they are not water soluble and subsequent coating layers can be applied.

EXAMPLES

Example 1: Preparation of Precursor Solutions

This example describes a method that has been used to prepare precursor solutions comprising metal suboxide cations based on hafnium (Hf) and/or zirconium (Zr).

Separate aqueous solutions were prepared for the components of the precursor solution. For convenience of notation, the respective solutions can be referred to as Part A for the metal suboxide cations, Part B for the peroxide-based ligand solution and Part C for the solution comprising polyatomic anions. A solution Part A1 was prepared by filtering a solution of 0.5 mol $ZrOCl_2.8H_2O$ (161.125, Alfa Aesar 99.9%) combined with 500 mL of ultrapure water (18-MΩ·cm electrical resistance). A solution Part A2 was prepared by filtering a solution of 0.5 mol $HfOCl_2.8H_2O$ (204.76 g, Alfa Aesar 98%) combined with 500 mL of ultrapure water. As described below, Part A1 was used to form precursor solutions for 193-nm lithography patterning, and Part A2 was used to form precursor solutions for 13-nm (also known as extreme UV or EUV) or electron-beam lithography patterning. Solution Part B was prepared by diluting $H_2O_2$(aq) (30% w/w, Mallinckrodt Baker) with ultrapure water to yield a 6-8% w/w $H_2O_2$(aq) solution. Solution Part C comprised 2-5 M $H_2SO_4$(aq) either obtained in certified concentrations (Fischer Scientific, 10 N) or diluted from concentrated solutions (98% $H_2SO_4$, Mallinckrodt Baker) with ultrapure water.

For 193-nm lithography patterning, a Zr based precursor solution was prepared. For EUV or electron-beam lithography patterning, an Hf based precursor solution was prepared. The method used to prepare either precursor solution was the same except that a Zr based precursor solution was prepared with Part A1 and an Hf based precursor solution was prepared with Part A2. Selected ratios of component solutions Part A1 or Part A2, Part B, and Part C were measured into individual pre-cleaned polyethylene bottles. A sufficient quantity of ultrapure water to obtain the targeted final metal concentration was added to the Part C component solution. The components in the bottles were then combined by pouring Part A1 or Part A2 component solution into Part B component solution, waiting 5 minutes, then pouring Part C into the combined Part A1 or Part A2 and Part B and waiting another 5 minutes. This particular mixing sequence has been found to limit particle growth.

Using the method described above, a 30 mL formulation of a Zr based precursor solution with a final zirconium concentration of 0.16 M was obtained by combining 4.8 mL of solution Part A1 (Zr), 1.8 mL of solution Part B ($H_2O_2$), 2.16 mL of solution Part C ($H_2SO_4$(aq)), and 21.24 mL of ultrapure water. Using the method described above, a 30 mL formulation of an Hf based precursor solution with a final hafnium concentration of 0.15 M was obtained by combining 4.5 mL of solution Part A2 (Hf), 16.875 mL of solution Part B ($H_2O_2$), 1.8 mL of solution Part C ($H_2SO_4$(aq)), and 6.825 mL of ultrapure water.

Example 2: Preparation and Deposition of Coating Material

This example describes preparation of substrate surfaces and deposition of patternable coating materials using the precursors solutions made according to Example 1.

Five inch silicon wafers were used for substrates. The surfaces of the silicon wafers were pretreated with a basic detergent, an acidic detergent, $O_2$ plasma, ultraviolet ozone, piranha etch solution or DMSO with a subsequent heating to a temperature between 225° C. and 275° C. to render the surfaces hydrophilic. The selected precursor solution was coated on a standard lithography spin coating track. A wafer was loaded onto a spin coater, and the precursor solution was dispensed onto the center of the wafer. The amount of precursor solution dispensed was selected based on the desired coating thickness and on the size of the wafer. The spin coater was spun at 100 RPM for 5 seconds to spread the resist across the wafer and then at 3000 RPM for 30-60 seconds to cast the resist film. The wafer was subjected to a pre-exposure bake at 40-200° C. for 0.1-5 minutes.

Figure 9:
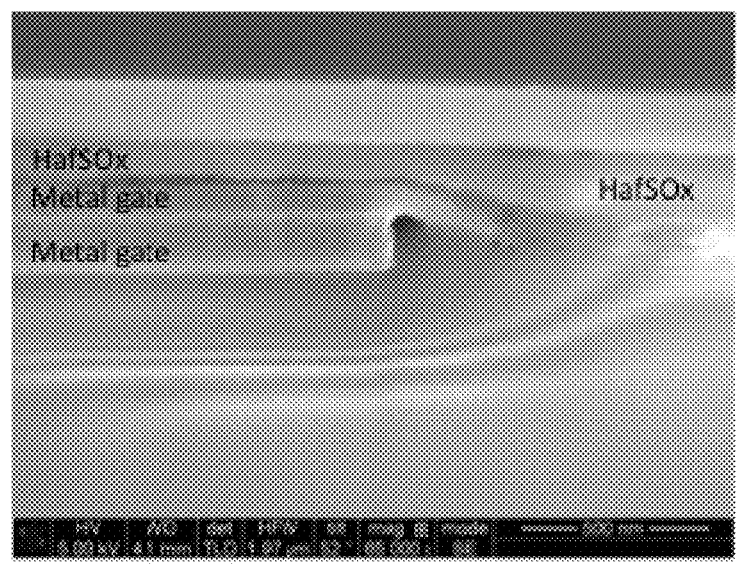
FIG. 9 is a scanning electron micrograph of step coverage over a metal gate line with a step of about 100 nm in height with Hf-based coating material.

This method has also been used to coat wafers with steps. FIG. 9 shows coverage of a Hf based coating material over a wafer with an approximately 100 nm step for a thin film transistor (TFT) gate dielectric application. The coating was created from five sequentially deposited layers to demonstrate that step coverage is possible. Appropriate coverage on sharper steps has been observed.

Example 3: 193-nm Lithographic Patterning of a Zr Based Coating Material

This example describes a method that has been used to pattern a Zr suboxide based coating material.

Figure 10:
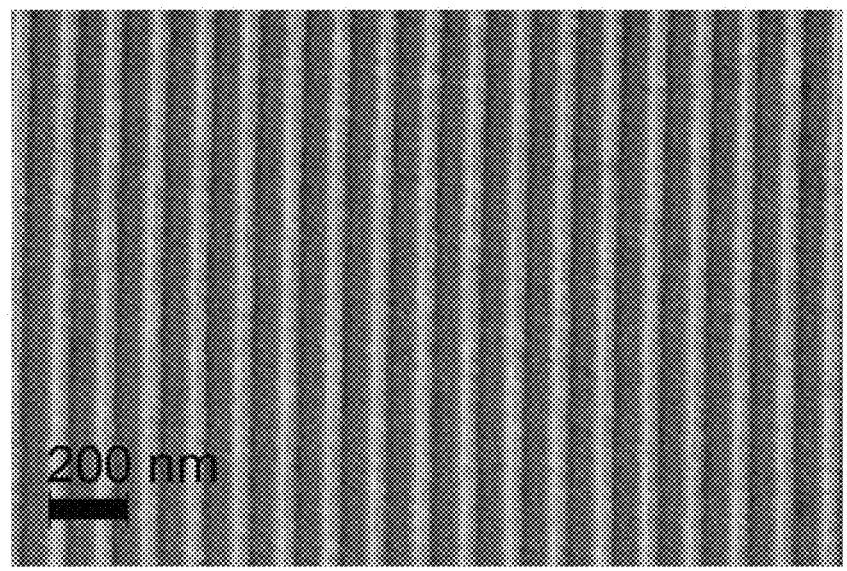
FIG. 10 is a scanning electron micrograph of 120-nm pitch lines in Zr-based coating material patterned via 193-nm wavelength interference lithography at a dose level of 20 mJ/cm$^2$.

The coating material was produced according to the method of Example 2 with a $ZrO^{+2}$-based coating composition. The coating material was deposited at a thickness form 10-50 nm. The Zr-based coating material was irradiated with patterned 193-nm (deep UV) light using a lithographic processing system having an ArF laser source with a mask or generated interference pattern. After irradiation, the wafer was passed back to the wafer track and subjected to a post-exposure bake at 40° C. to 200° C. for 1-5 minutes. The exposure with the 193 nm UV light resulted in a patterned coating material. The patterned coating material was developed with 2.38 weight percent TMAH using a puddle development process. The TMAH was contacted with the coating material for 20 seconds, and then the substrate was rinsed with water and dried. Referring to FIG. 10, highly resolved patterns were produced using the developer. FIG. 10 is a pattern of 120-nm pitch lines (approximately 60 nm lines and spaces) in a Zr-based coating material produced by 193-nm lithography at a dose level of 20 mJ/cm².

Example 4: Electron-Beam and EUV Lithographic Patterning of an Hf Based Coating Material This example describes a method that has been used to pattern an Hf suboxide based coating material.

Figure 11:
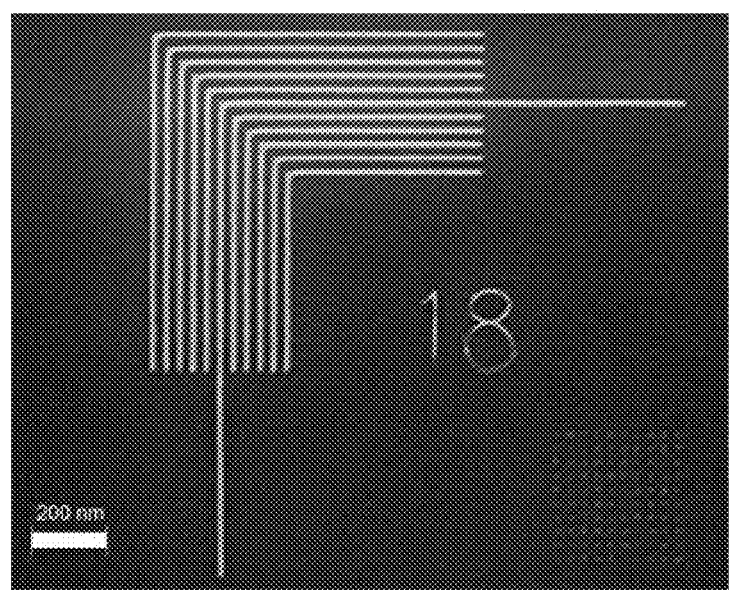
FIG. 11 is a scanning electron micrograph of 36-nm pitch lines in Hf-based coating material patterned via electron-beam lithography.
Figure 12:
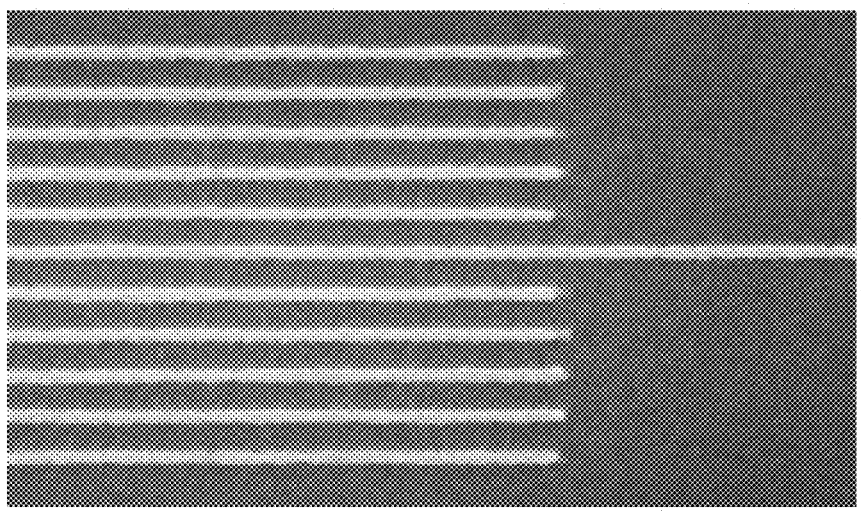
FIG. 12 is an expanded view of a portion of the pattern shown in FIG. 11.

The coating material was produced and deposited according to the method of Example 2 with an $HfO^{+2}$ based coating composition. In one embodiment, an Hf-based coating composition was exposed with an electron-beam at 30 keV and about 78 μC/cm². The resulting patterned coating material was developed with 2.38 to 25 weight percent TMAH using a dip method. The developer was contacted with the wafer for 20 seconds. Then, the wafer was rinsed with water and dried. Contact with the developer results in the pattern as shown in FIGS. 11, 12, 13A, and 13B. Highly resolved patterns were produced. FIG. 11 shows 36-nm pitch lines in Hf-based coating material. Another pattern with a pitch of 36-nm is shown in FIG. 12. This pattern was generated with an e-beam dose of 244 µC/cm².

Figures 13A, 13B:
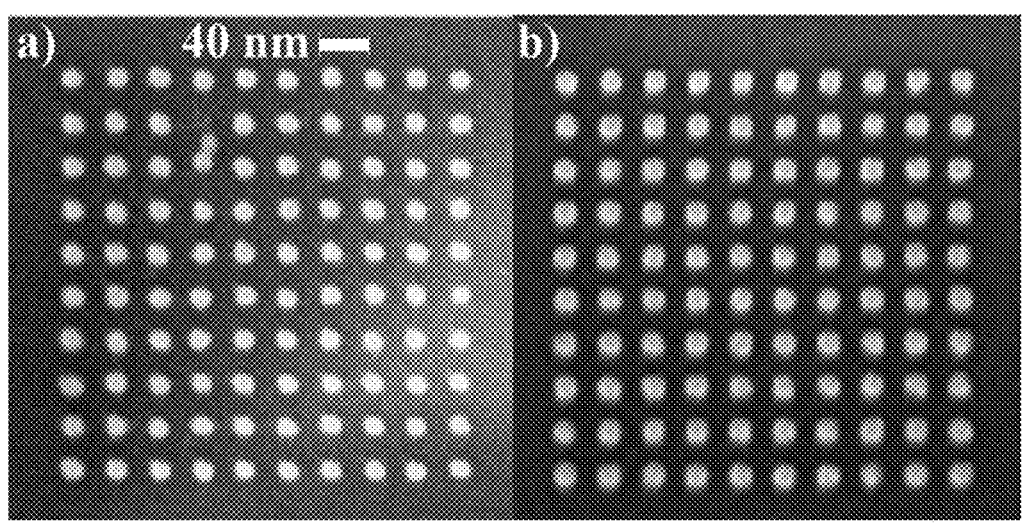
FIG. 13A is a scanning electron micrograph of 36 nm pitch posts patterned by e-beam developed in 2.38% TMAH.
FIG. 13B is a scanning electron micrograph of 36 nm pitch posts patterned by e-beam developed in 25% TMAH.
Figure 14:
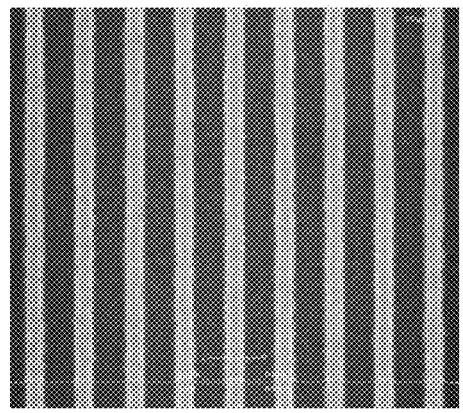
FIG. 14 is a scanning electron micrograph of a portion of a developed pattern having a line with roughness from 1.6-1.8 nm.

FIGS. 13A and 13B show 36-nm pitch posts in Hf-based coating material patterned by electron beam radiation. The sample shown in FIG. 13A was developed with a 2.38 weight percent TMAH concentration, while the sample shown in FIG. 13B was developed with a 25 weight percent TMAH concentration. A 25 weight percent TMAH concentration development resulted in more accurately defined posts, but these samples involved about 8×higher electron beam dose. A pattern with a 1.6 to 1.8 nm line width roughness is shown in FIG. 14 for a pattern with a 21 nm linewidth on a 60 nm pitch.

Figure 15:
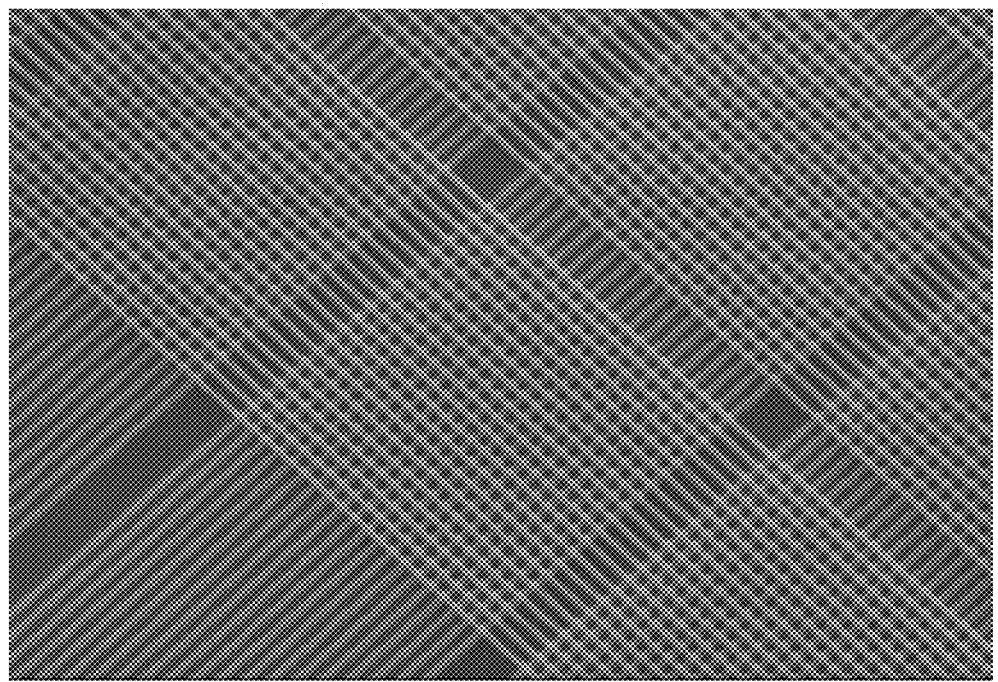
FIG. 15 is a scanning electron micrograph of a double patterned structure formed using e-beam lithography with a coating material as described herein.
Figure 16:
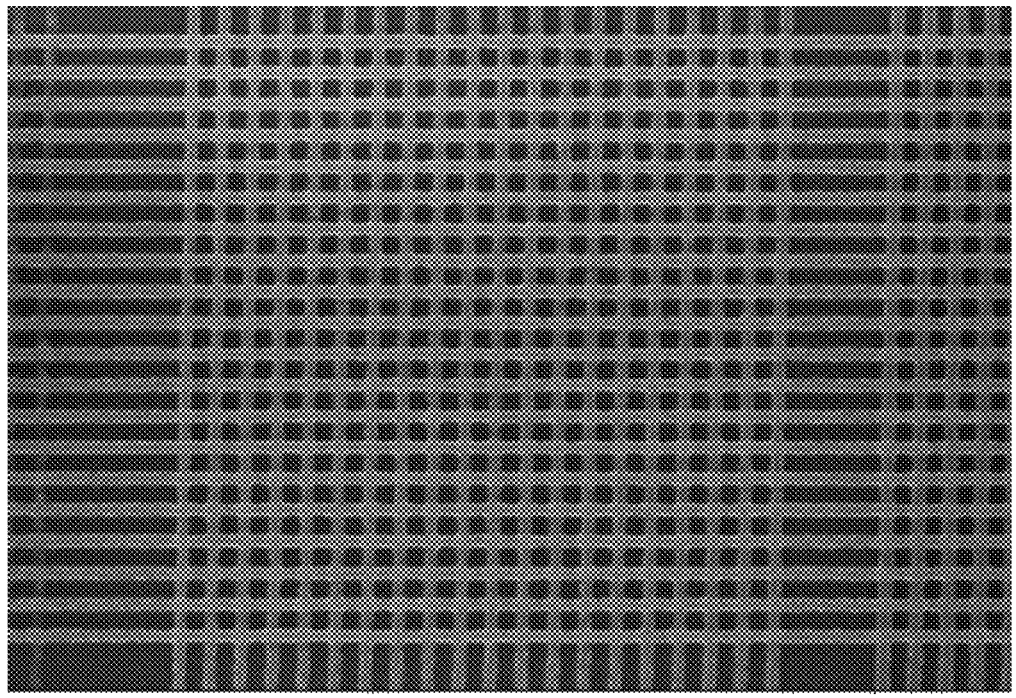
FIG. 16 is an expanded view of a portion of the pattern shown in FIG. 15.

A double patterned structure is shown in FIGS. 15 and 16. The patterning was performed with a 30 keV electron beam with a dose of 500 µC/cm². After the first layer was patterned, the coating was baked at 220 C before the second coating was applied. A higher magnification view is shown in FIG. 16. Well resolved and uniform 30-nm contact holes are visible in FIG. 16.

Figure 17:
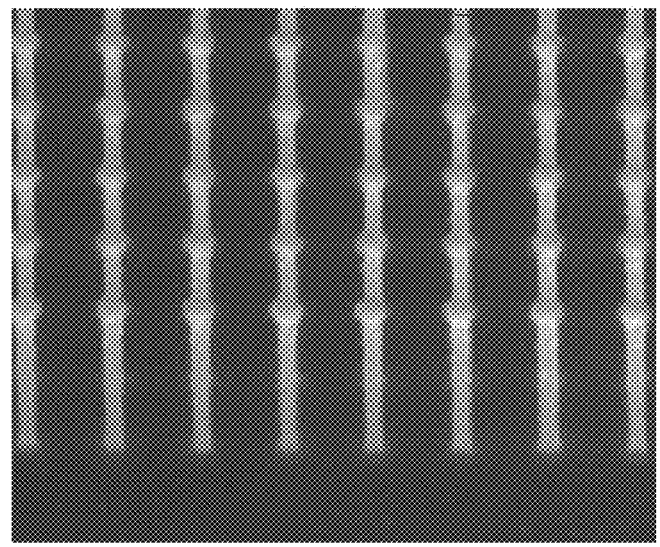
FIG. 17 is a scanning electron micrograph of etched silicon nanopillars of width 40 nm. The pillars were fabricated via ion-etching through a hard mask formed with a Hf-based coating material.
Figures 18A, 18B:
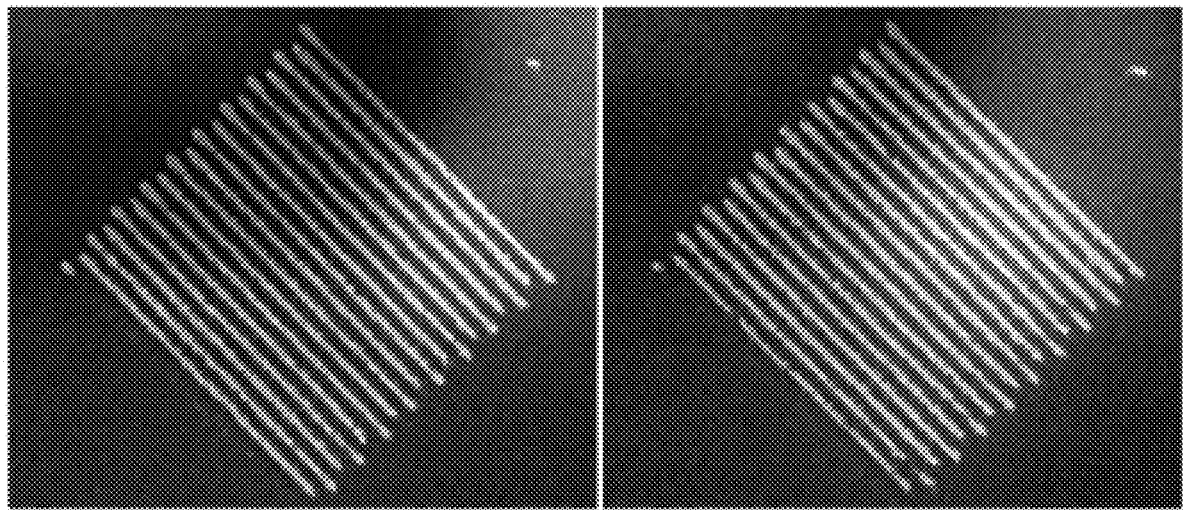
FIGS. 18A-D are scanning electron micrographs of EUV lithography performed with the Hf-based coating materials described herein and developed in 25% TMAH. In each case, the figure shows lines and spaces of a given pitch, comprised of lines with widths approximately half the stated pitch: A) 32-nm pitch lines and spaces, B) 30-nm pitch lines and spaces, C) 28-nm pitch lines and spaces, D) 26-nm pitch lines and spaces.
Figures 18C, 18D:
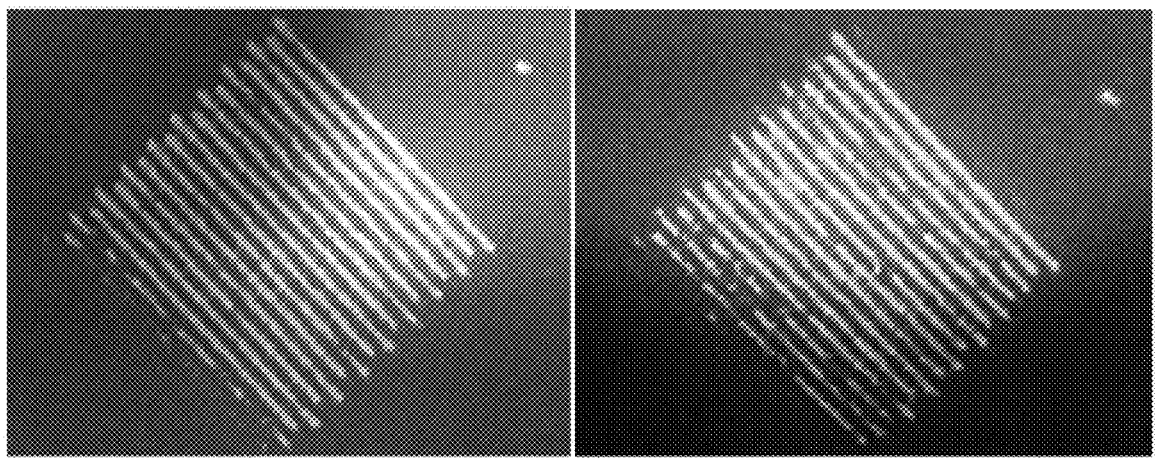

Ion etching was performed through a hard mask formed with a Hf-based coating material as described in this example after developing. The coating material functioned as a mask for the ion etching. A scanning electron micrograph of silicon nanopillars is shown in FIG. 17. The patterned structure after ion etching had a pillar width of 40 nm. The mask exhibited excellent resistance to the ion etch.

The EUV images were obtained using projection lithography with a numerical aperture of 0.25 operating at 13 nm. The resist was applied with a thickness of 20 nm by spin coating on a silicon wafer, followed by a post-apply bake of 50° C. After exposure at approximately 80 mJ/cm², a post-exposure bake of 75° C. was used prior to development in 25% TMAH. The developed patterns are shown in FIGS. 18A-D. The patterns shown in FIG. 18 have pitches of A) 32-nm, B) 30-nm, C) 28-nm and D) 26-nm.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What we claim is:

1. A method for forming a patterned structure comprising a substrate and a patterned coating material on a surface of the substrate, the method comprising:
    irradiating along a selected pattern, a layer of coating material on the surface of the substrate having an average thickness from 5 nm to 30 nm with EUV radiation at a dose of no more than about 100 mJ/cm²; and
    contacting the irradiated layer with a developing composition to dissolve un-irradiated material to form a patterned coating material according to the selected pattern.

2. The method of claim 1 wherein the irradiation is performed with EUV at a dose of no more than about 90 mJ/cm².

3. The method of claim 1 wherein the selected pattern has a pitch of no more than about 60 nm.

4. The method of claim 1 wherein the developing composition comprises tetramethyl ammonium hydroxide.

5. The method of claim 1 wherein following exposure an exposed coating region is insoluble in an aqueous base.

6. The method of claim 1 wherein following exposure an exposed coating region is soluble in an organic solvent.

7. The method of claim 1 further comprising heating the coated substrate after irradiation to a temperature of at least about 45° C. prior to contacting the irradiated layer with the developing composition.

8. The method of claim 1 further comprising heating the substrate with the patterned coating material to a temperature from about 150° C. to about 600° C. for from one minute to 25 minutes to form a post-patterning condensed structure.

9. The method of claim 8 further comprising performing a second patterning using the post-patterning condensed structure to form a double patterned structure.

10. The method of claim 1 wherein the coating material prior to irradiation comprises metal ions with radiation sensitive ligands and wherein interaction of the coating material with EUV alters the chemical properties of the coating material creating a structure with differential dissolution rates.

11. The method of claim 10 wherein the metal of the metal ions comprises Cu, Al, Sc, Ti, V, Cr, Mn, Fe, Co, Ni, Zn, Y, Zr, Nb, Mo, In, Sn, Sb, Hf, Ta, W, Ir, Pt, La, Ce, Pr, Nb, Pm, Sm, Eu, Gd, Tb, Dy, Ho, Er, Tm, Yb, Lu or a combination thereof.

12. The method of claim 10 wherein the radiation sensitive ligands comprise peroxide ligands, and wherein the coating material further comprises metal suboxide cations.

13. The method of claim 12 wherein the coating material further comprises inorganic polyatomic anions and wherein the peroxide ligand to metal ion ratio is at least about 2.

14. A method for forming a patterned inorganic material on a substrate, the method comprising:
    irradiating a coated substrate with a pattern of radiation wherein the coated substrate comprises a coating with a radiation patternable coating material comprising metal suboxide cations, ligands comprising a peroxide group and inorganic polyatomic anions and wherein irradiation creates a differential dissolution rate between irradiated and un-irradiated locations, wherein the coating material is formed by removing solvent from a deposited precursor solution wherein the peroxide ligand to metal suboxide cation ratio is at least about 2; and
    heating the coated substrate after irradiation to a temperature of at least about 45° C. prior to contacting the coating with a developing composition.

15. The method of claim 14 further comprising contacting the coated substrate after heating with a developing composition to remove un-irradiated coating material to form the patterned inorganic material.

16. The method of claim 15 wherein the patterned inorganic material has edges with an average line-width roughness no more than about 2.25 nm at a pitch of no more than about 60 nm or for individual features having an average width of no more than about 30 nm.

17. The method of claim 14 wherein the metal suboxide cations comprise Cu, Al, Sc, Ti, V, Cr, Mn, Fe, Co, Ni, Zn, Y, Zr, Nb, Mo, In, Sn, Sb, Hf, Ta, W, Ir, Pt, La, Ce, Pr, Nb, Pm, Sm, Eu, Gd, Tb, Dy, Ho, Er, Tm, Yb, Lu or a combination thereof.

18. The method of claim 14 wherein the irradiating step comprises irradiation with extreme ultraviolet light at a dose of no more than about 100 mJ/cm$^2$ or with an electron beam at a dose equivalent to no more than about 300 μC/cm$^2$ at 30 kV.

19. The method of claim 14 wherein the coating has an average thickness of about 5 nm to about 30 nm.

\* \* \* \* \*